United States Patent [19]

Takasu et al.

[11] Patent Number: 5,261,961
[45] Date of Patent: Nov. 16, 1993

[54] DEVICE FOR FORMING DEPOSITED FILM

[75] Inventors: Katsuji Takasu; Hisanori Tsuda; Masafumi Sano, all of Atsugi; Yutaka Hirai, Tokyo, all of Japan

[73] Assignee: Canon Kabushiki Kaisha, Tokyo, Japan

[21] Appl. No.: 908,891

[22] Filed: Jul. 8, 1992

Related U.S. Application Data

[63] Continuation of Ser. No. 776,684, Oct. 15, 1991, abandoned, which is a continuation of Ser. No. 568,621, Aug. 16, 1990, abandoned, which is a continuation of Ser. No. 368,136, Jun. 16, 1989, abandoned, which is a continuation of Ser. No. 888,233, Jul. 21, 1986, abandoned.

[30] Foreign Application Priority Data

| | | | |
|---|---|---|---|
| Jul. 23, 1985 | [JP] | Japan | 60-161132 |
| Jul. 23, 1985 | [JP] | Japan | 60-161133 |
| Jul. 23, 1985 | [JP] | Japan | 60-161134 |
| Jul. 23, 1985 | [JP] | Japan | 60-161135 |
| Jul. 23, 1985 | [JP] | Japan | 60-161136 |
| Jul. 23, 1985 | [JP] | Japan | 60-161137 |
| Jul. 23, 1985 | [JP] | Japan | 60-161138 |

[51] Int. Cl.$^5$ .............. C23C 16/46; C23C 16/48; C23C 16/50; C23C 16/52
[52] U.S. Cl. .............. 118/722; 118/723 R; 118/724; 118/725; 118/665
[58] Field of Search .............. 118/665, 722, 723, 724, 118/725

[56] References Cited

U.S. PATENT DOCUMENTS

| | | | |
|---|---|---|---|
| 4,058,430 | 11/1977 | Suntola | 427/255 |
| 4,183,780 | 1/1980 | McKenna | 156/345 |
| 4,433,951 | 2/1984 | Koch | 414/222 |
| 4,435,445 | 3/1984 | Allred | 427/54.1 |
| 4,488,506 | 12/1984 | Heinecke | 118/726 |
| 4,522,674 | 6/1985 | Ninomiya | 118/620 |
| 4,525,376 | 6/1985 | Edgerton | 427/10 |
| 4,624,736 | 11/1986 | Gee | 427/54.1 |
| 4,625,678 | 12/1986 | Shioya | 118/724 |
| 4,640,221 | 2/1987 | Barbee | 118/715 |
| 4,657,617 | 4/1987 | Johnson | 156/643 |
| 4,659,401 | 4/1987 | Reif | 427/39 |
| 4,668,337 | 5/1987 | Sekine | 156/345 |
| 4,687,544 | 8/1987 | Bersin | 156/345 |
| 4,716,852 | 1/1988 | Tsujii | 118/723 |
| 4,726,963 | 2/1988 | Ishihara | 437/233 |
| 4,772,485 | 9/1988 | Ebata | 427/10 |

OTHER PUBLICATIONS

Abeles et al., Physical Review Letters, vol. 51, No. 21, Nov. 21, 1983, pp. 2003-2006.

Primary Examiner—Richard Bueker
Attorney, Agent, or Firm—Fitzpatrick, Cella, Harper & Scinto

[57] ABSTRACT

A device for forming a deposited film is provided. It comprises (a) a reaction chamber; (b) a heating means for heating a substrate placed in the reaction chamber; (c) a starting gas introducing means for introducing starting gases into the reaction chamber, the gas introducing means having a means for introducing two or more kinds of gases alternately and intermittently into the reaction chamber; (d) a decomposing means for decomposing the starting gases in the reaction chamber so as to form a deposited film on the substrate heated by said heating means in the reaction chamber, the decomposing means having a light source which irradiates at least one kind of light into the reaction chamber to decompose the starting gases.

1 Claim, 15 Drawing Sheets

| Fig. 2A | Fig. 2B |

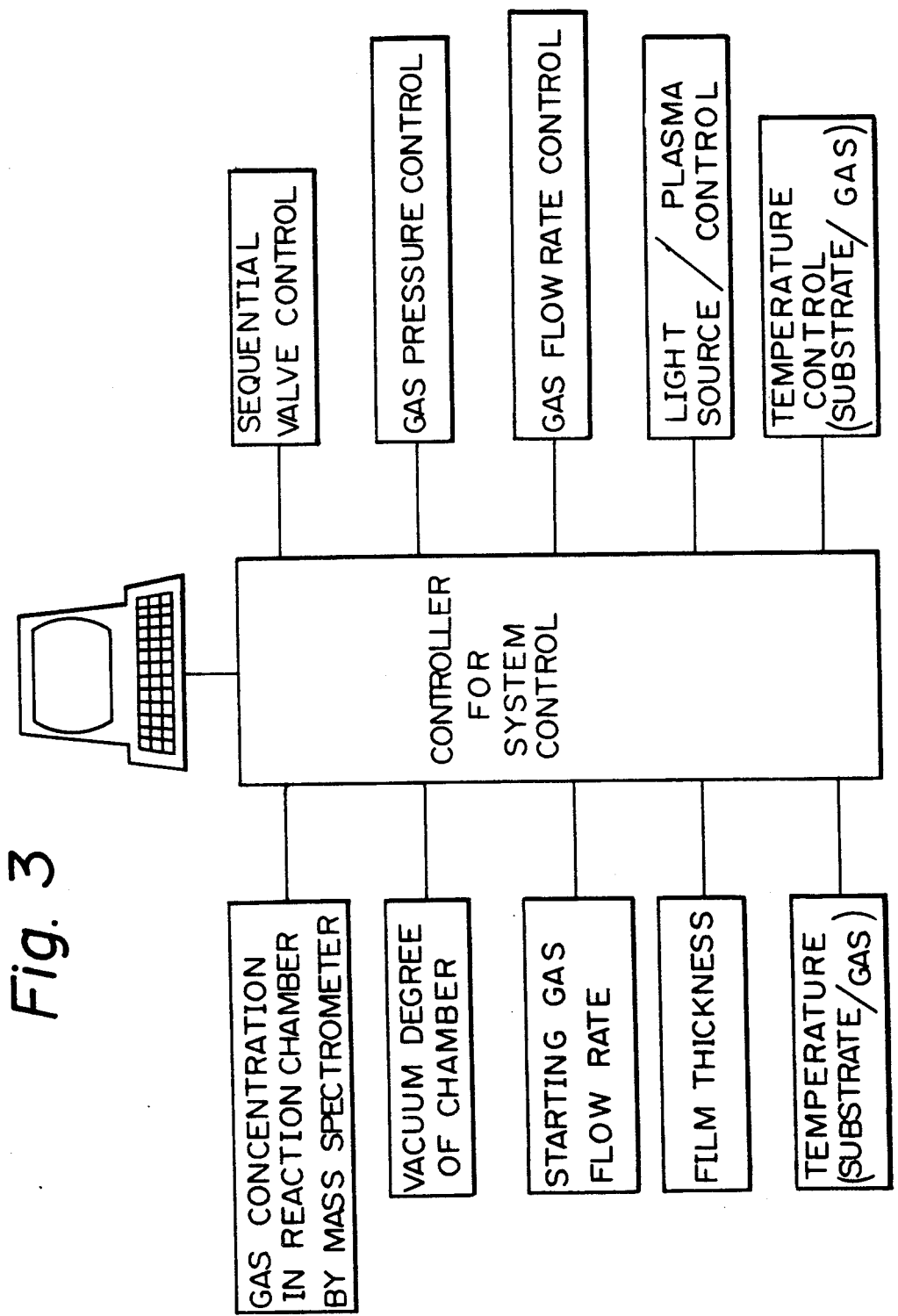

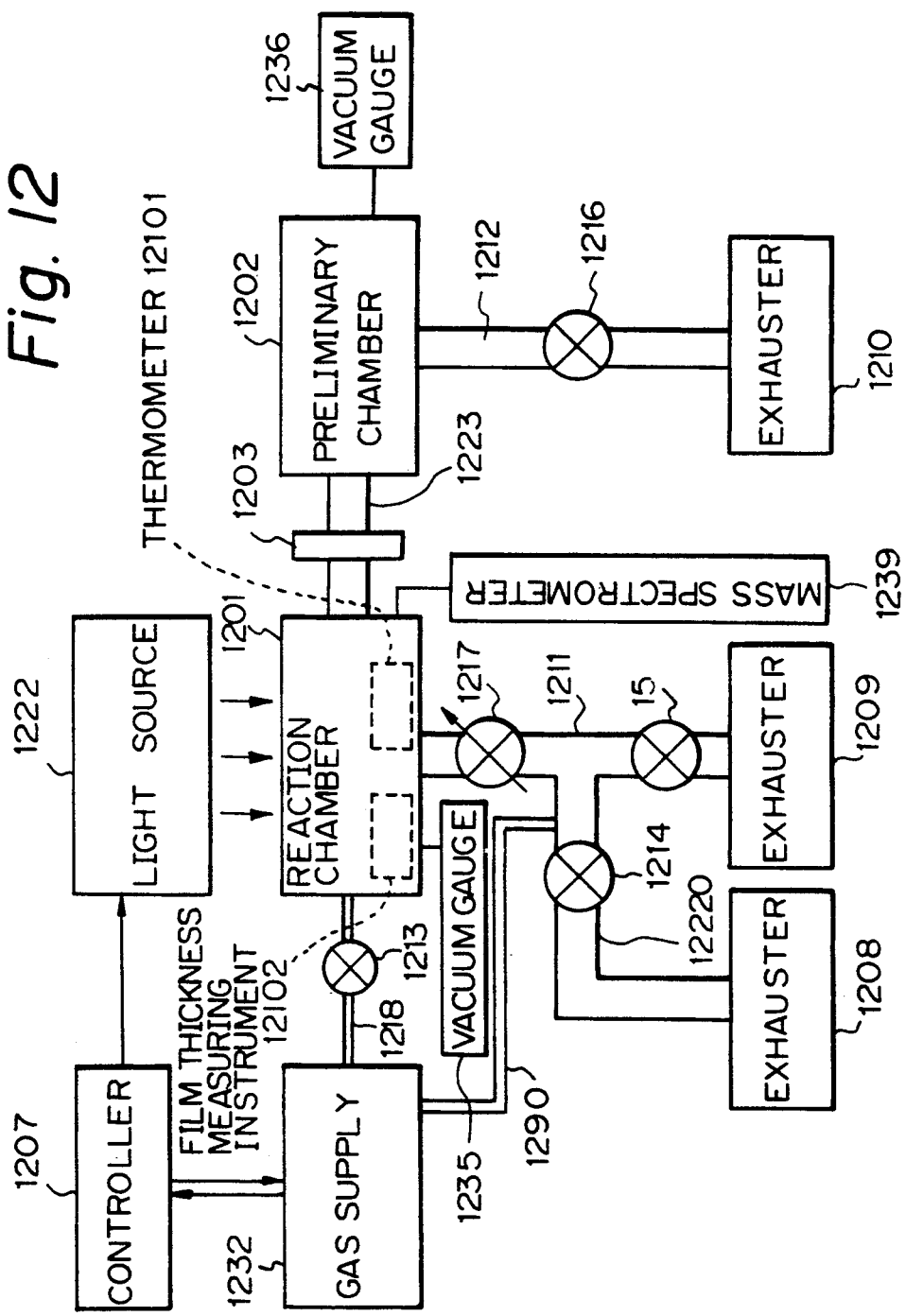

DEVICE FOR FORMING DEPOSITED FILM

This application is a continuation-in-part of application Ser. No. 07/776,684 filed Oct. 15, 1991, which is a continuation of application Ser. No. 07/568,621 filed Aug. 16, 1990, which is a continuation of application Ser. No. 07/368,136 filed Jun. 16, 1989, which is a continuation of application Ser. No. 07/888,233 filed Jul. 21, 1986, all abandoned.

BACKGROUND OF THE INVENTION

1. Field of the Invention

This invention relates to a device for forming a deposited film suitable for laminating layers comprising a non-single crystalline semiconductor containing a semiconductor material such as silicon and/or germanium or layers comprising an insulating material such as SiN and $SiO_2$ or layers comprising a metal in multiple layers on a supporting member.

2. Related Background Art

For example, as a device for preparing a crystalline semiconductor multi-layer film (a film having respective layers which are sufficiently thin and exhibiting the quantum size effect is generally called "semiconductor superlattice"), the device using the molecular beam epitaxy method by use of ultra-high-vacuum has been well known in the art.

On the other hand, recently also in the field of non-single crystalline semiconductor, multi-layer thin films have been prepared. However, in this field only the preparation method by use of the glow discharge method has been reported up to date (for example, B. Abeles and T. Tiedje, Physical Review Letters, Vol. 51 (1983) p.p. 2003-2006).

In the device using the glow discharge method as mentioned above, RF discharging is generally used and therefore discharging tends to be unstable due to poor matching with power source at initiation of discharging. Accordingly, particularly when preparing a thin film of about 10 Å, it becomes very difficult to control the film thickness. Also, the thin film is directly formed in a discharging atmosphere and, besides, a large number of ion species having high energy are included in the discharging atmosphere. Therefore, during formation of multiple layers of thin films, the interface between the respective layers of thin films is roughened by such ion species, whereby it has not been easy to obtain a multi-layer thin film of high quality.

Thus, according to the glow discharge method of the prior art, a non-single crystalline semiconductor multi-layer thin film can be prepared only with difficulty.

SUMMARY OF THE INVENTION

The present invention has been accomplished in order to remove the drawbacks of the prior art as described above, and its main object is to provide a device for forming a deposited film, which can prepare a non-single crystalline semiconductor multi-layer laminated thin film of high quality.

Another object of the present invention is also to improve a device for forming a deposited film by providing a reaction chamber, a heating means for heating a supporting member placed in the reaction chamber, a starting gas introducing means for introducing a starting gas into the reaction chamber, and a decomposing means for decomposing the starting gas so as to form a deposited film on the heated supporting member heated by the heating means in the reaction chamber.

According to an object of the present invention, there is provided a device for forming a deposited film, comprising: a reaction chamber; a heating means for heating a substrate placed in said reaction chamber; a starting gas introducing means for introducing starting gases into the reaction chamber, the gas introducing means having a means for introducing two or more kinds of gases alternately and intermittently into the reaction chamber; a decomposing means for decomposing the starting gases in the reaction chamber so as to form a deposited film on the substrate heated by the heating means in the reaction chamber, the decomposing means having a light source which irradiates at least one kind of light into the reaction chamber to decompose the starting gases.

According to another object of the present invention, there is provided a device for forming a deposited film, comprising: a reaction chamber; a starting gas introducing means for introducing two or more kinds of starting gases into the reaction chamber; a decomposing energy introducing means for introducing at least the energy necessary for decomposing starting gases into the reaction chamber so as to form a thin film deposited on a substrate in the reaction chamber; and a controlling means for controlling the gas introducing means and the decomposing energy introducing means following the timing previously set so as to deposit a multi-layer thin film on the substrate in the reaction chamber.

According to still another aspect of the present invention, there is provided a device for forming a deposited film, comprising: a reaction chamber; a temperature control means for heating or cooling a substrate placed in the reaction chamber; a starting gas introducing means for introducing two or more kinds of starting gases into the reaction chamber; a light source for decomposing the starting gases by irradiating at least one kind of light in the reaction chamber so as to deposit a thin film on the substrate controlled to a predetermined temperature by the temperature control means in the reaction chamber; and a means for controlling switching of the starting gas species and timing of light irradiation from the light source following the timing previously set so as to form a multi-layer thin film on the substrate.

According to a further aspect of the present invention, there is provided a device for forming a deposited film, comprising: a reaction chamber; a temperature control means for heating or cooling a substrate placed in said reaction chamber; a starting gas introducing means for introducing two or more kinds of starting gases into the reaction chamber; a decomposing means for decomposing the starting gases in the reaction chamber so as to deposit a thin film on the substrate controlled to a predetermined temperature by the temperature control means in the reaction chamber; and a control means for controlling the gas introducing means and the decomposing means; the decomposing means having a light source for decomposing the starting gases by irradiating at least one kind of light in the reaction chamber and a means for decomposing the starting gases by introducing the radical species generated within a plasma chamber connected to the reaction chamber; the control means having a means for controlling switching of the starting gas species, timing of light irradiation from the light source and introduction of the radical seeds into the reaction chamber following the timing previously set so as to deposit a multi-layer thin film on the substrate.

According to a still further aspect of the present invention, there is provided a device for forming a deposited film, comprising: a reaction chamber; a temperature control means for heating or cooling a substrate placed in the reaction chamber; a starting gas introducing means for introducing two or more kinds of starting gases into the reaction chamber; a light source for decomposing starting gases by irradiating at least one kind of light in the reaction chamber so as to deposit a thin film on the substrate controlled to a predetermined temperature by the temperature control means in said reaction chamber; a film thickness measuring means for measuring the thickness of the film deposited on the substrate in the reaction chamber; and a control means for controlling the starting gas introducing means and the light source based on the measured values of the measuring means.

BRIEF DESCRIPTION OF THE DRAWINGS

FIG. 3 is a conceptional illustration showing the kinds of controls by the controller for system control and the input informations for control;

FIG. 12 and FIG. 14 are each schematic constitutional illustration showing another embodiment of the device for forming a deposited film according to the present invention.

DESCRIPTION OF THE PREFERRED EMBODIMENTS

Figure 1:
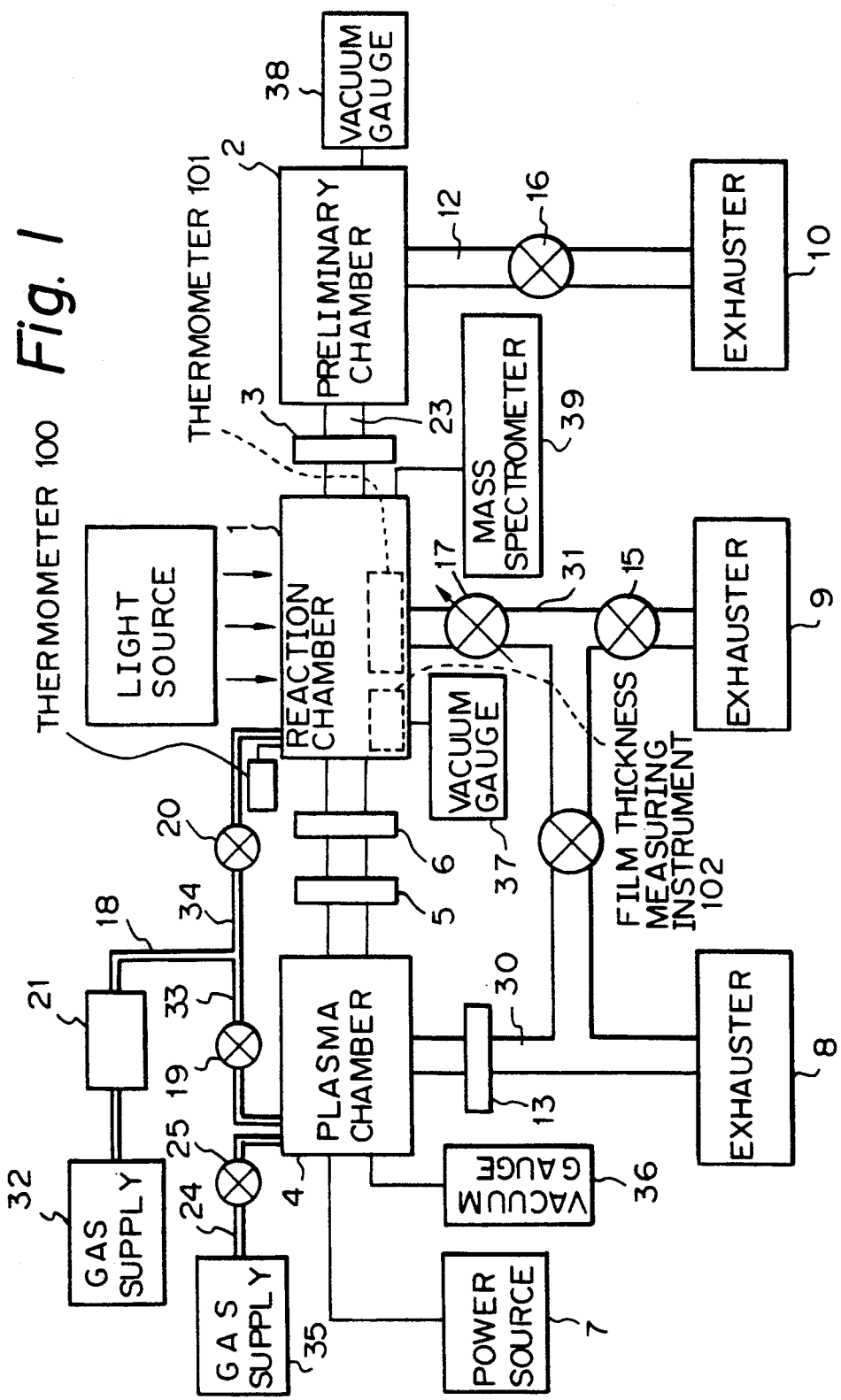
FIG. 1 is a schematic illustration showing one example of the device for forming a deposited film according to the present invention.

FIG. 1 shows one example of the device for forming deposited film according to the present invention.

In FIG. 1, 1 is a reaction chamber, and 2 is a preliminary chamber connected continuously through a gate valve 3 to the reaction chamber 1. 4 is a plasma chamber connected continuously through a gate valve 5 and a variable orifice 6 to the reaction chamber 1. 7 is a power source for discharging of RF or microwave for generating plasma discharge in the plasma chamber 4.

8, 9 and 10 are exhausters for exhaustion from the plasma chamber 4, the reaction chamber 1 and the preliminary chamber 2, respectively. The exhauster 8 is connected through an exhausting pipe 30 to the plasma chamber 4, the exhauster 9 through an exhausting pipe 31 to the reaction chamber 1 and the exhauster 10 through an exhausting pipe 12 to the preliminary chamber 2. Particularly, in order that the exhausting capacity can be controlled depending on the pressure in the reaction chamber 1 and the flow rate of the reaction gas required during formation of deposited film, the exhauster 8 should preferably be a turbo-molecular pump or a combination of a diffusion pump with a rotary pump, and the exhauster 9 is preferably a combination of a mechanical booster pump with a rotary pump.

13 is a gate valve provided at the exhausting pipe 30, 17 is a throttle valve provided at the exhausting pipe 31, 15 is a stop valve provided at the exhausting pipe 31 on the downstream side of the valve 17, 11 is a connecting pipe which connects the two discharging pipes 30 and 31 at the positions between the gate valve 13 and the exhauster 8 and between the two valves 15 and 17. 14 is a stop valve provided at the connecting pipe 11, and 16 is a stop valve provided at the exhausting pipe 12.

32 is a starting gas supply, and the starting gas from this gas supply is supplied through a supplying pipe 18 and a branching pipe 33 to the plasma chamber 4, and also through a supplying pipe 18 and a branching pipe 34 into the reaction chamber 1. 21 is a heater mounted in the course of the supplying pipe 18, and the starting gas from the gas supply 32 is heated by the heater to, for example, previously set temperature. 19 and 20 are stop valves provided in the course of the branching pipes 33 and 34, respectively.

22 is a light source for photolysis of the reaction gas introduced into the reaction chamber 1, and the light is permitted to enter the reaction chamber 1 though a window provided thereat. Specific examples of the light source 22 may include a low pressure mercury lamp, Xe lamp, Xe-Hg lamp, excimer laser, argon laser, Nd-YAG laser and $CO_2$ laser.

35 is a reaction gas supply for generation of plasma, and the reaction gas from this gas supply is supplied through a supplying pipe 24 into the plasma chamber 4. A stop valve 25 is mounted in the course of the supplying pipe 24. 23 is a substrate conveying mechanism which is driven by oil pressure, etc., and conveys the substrate between the preliminary chamber 2 and the reaction chamber 1.

36, 37 and 38 are vacuum gauges for measuring the vacuum degrees in the plasma chamber 4, the reaction chamber 1 and the preliminary chamber 2, respectively.

39 is a mass spectrometer for measuring the concentration of the starting material in the reaction chamber 1, and 100 is a thermometer for measuring the temperature of the starting gas supplied to the reaction chamber 1. 101 is a thermometer for measuring the temperature of the substrate on which a thin film is deposited, being specifically constituted of a thermocouple mounted on a substrate holder (not shown) arranged in the reaction chamber 1 (the substrate temperature can also be estimated by measuring, for example, the temperature of the substrate holder). 102 is a film thickness measuring instrument for measuring the thickness of the thin film deposited on the substrate, typically, for example, an ellipsometer, etc.

Figures 2, 2A:
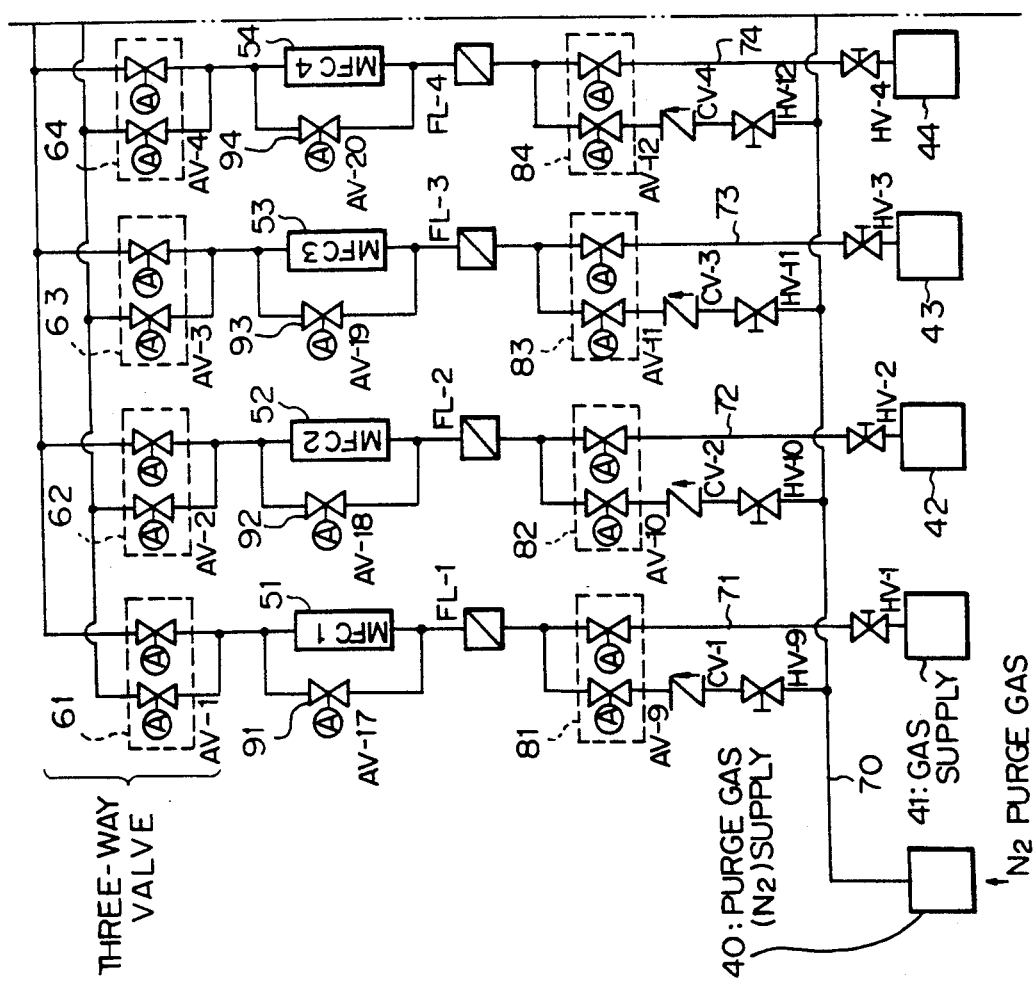
FIGS. 2A and 2B are schematic illustration showing the construction of the starting gas supply.
Figure 2B:
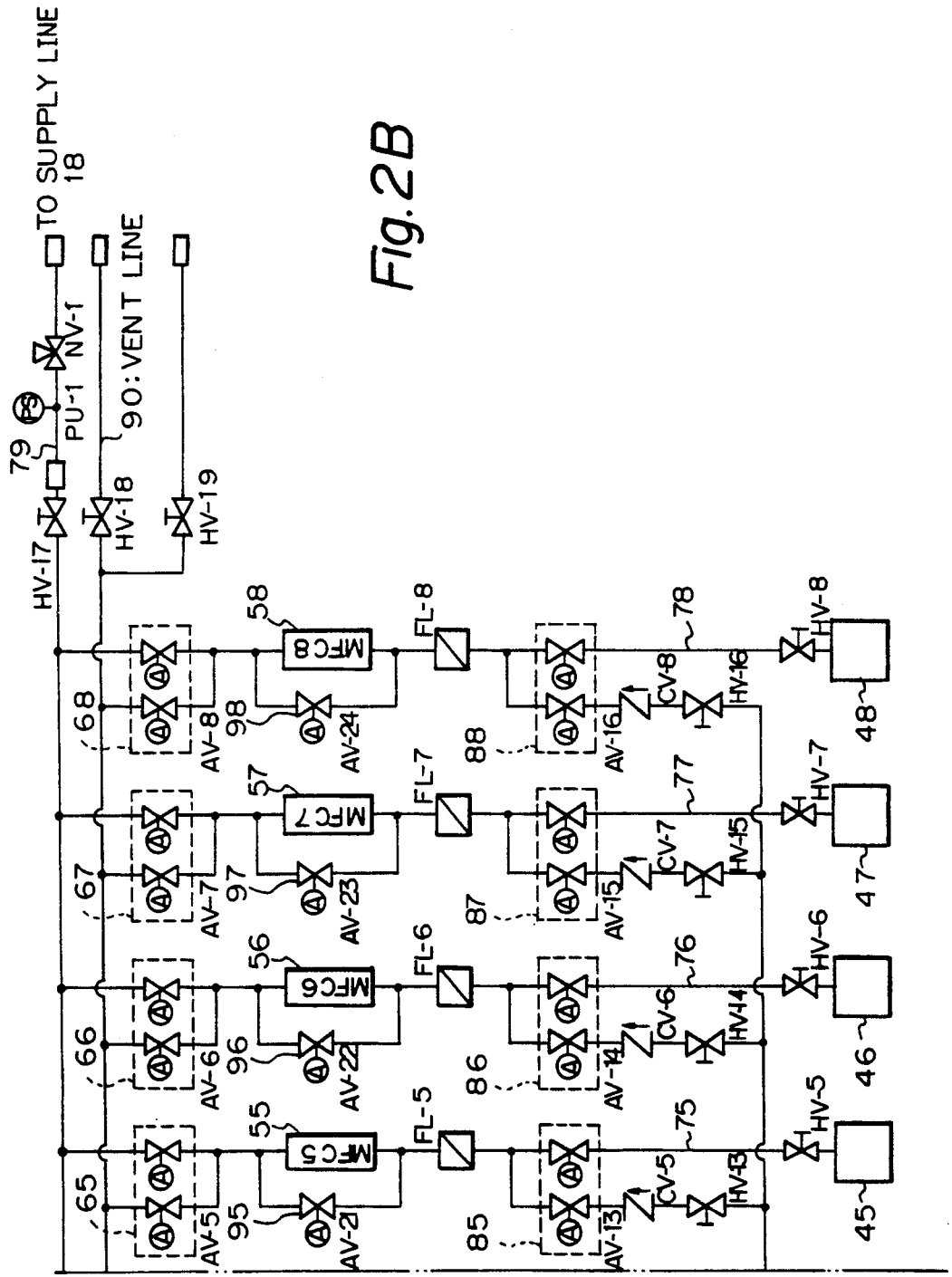

FIG. 2 shows one example of a specific constitution of the gas supply as shown in FIG. 1 for supplying the starting gas into the reaction chamber 1.

In FIG. 2, 40 is a purge gas ($N_2$) supply, and 41-48 are starting gas supplies (e.g. $SiH_4$, $Si_2H_6$, $B_2H_6$, $PH_3$, $CH_4$, $CF_4$, and $NH_3$) for forming deposited films. The gases from the respective gas supplies 41-48 are supplied through the respective pipes 71-78, further through the respective three-way valves 81-88 provided at said respective pipes 71-78, the respective mass flow controllers 51-58 capable of controlling the flow rates and measuring the flow rates and the respective three-way valves 61-68 into the main pipe 79, suitably mixed in the main pipe 79 and then supplied into the supplying pipe 18.

On the other hand, the gas from the purge gas supply 40 is supplied through the pipe 70 and the three-way valves 81–88 into the pipes 71–78 to purge the respective pipes 71–78 and the main pipe 79. The respective valves 61–68, 81–88, 91–98 and the respective mass flow controllers 51–58 are controlled by a system controlling controller as described below.

FIG. 3 is a conceptional illustration showing the kinds of control by the system control controller and the input information for control. As shown in the drawing, based on the input informations (measured values) such as the concentration of the starting gas in the reaction chamber, the flow rate of the starting gas, the vacuum degrees in the respective chambers, the film thickness of the deposited film, the substrate temperature, the gas temperature, etc., sequential valve control, gas pressure control, gas flow rate control, light source/plasma control, temperature control (substrate/gas) are performed by the controller for system control.

Figure 4:
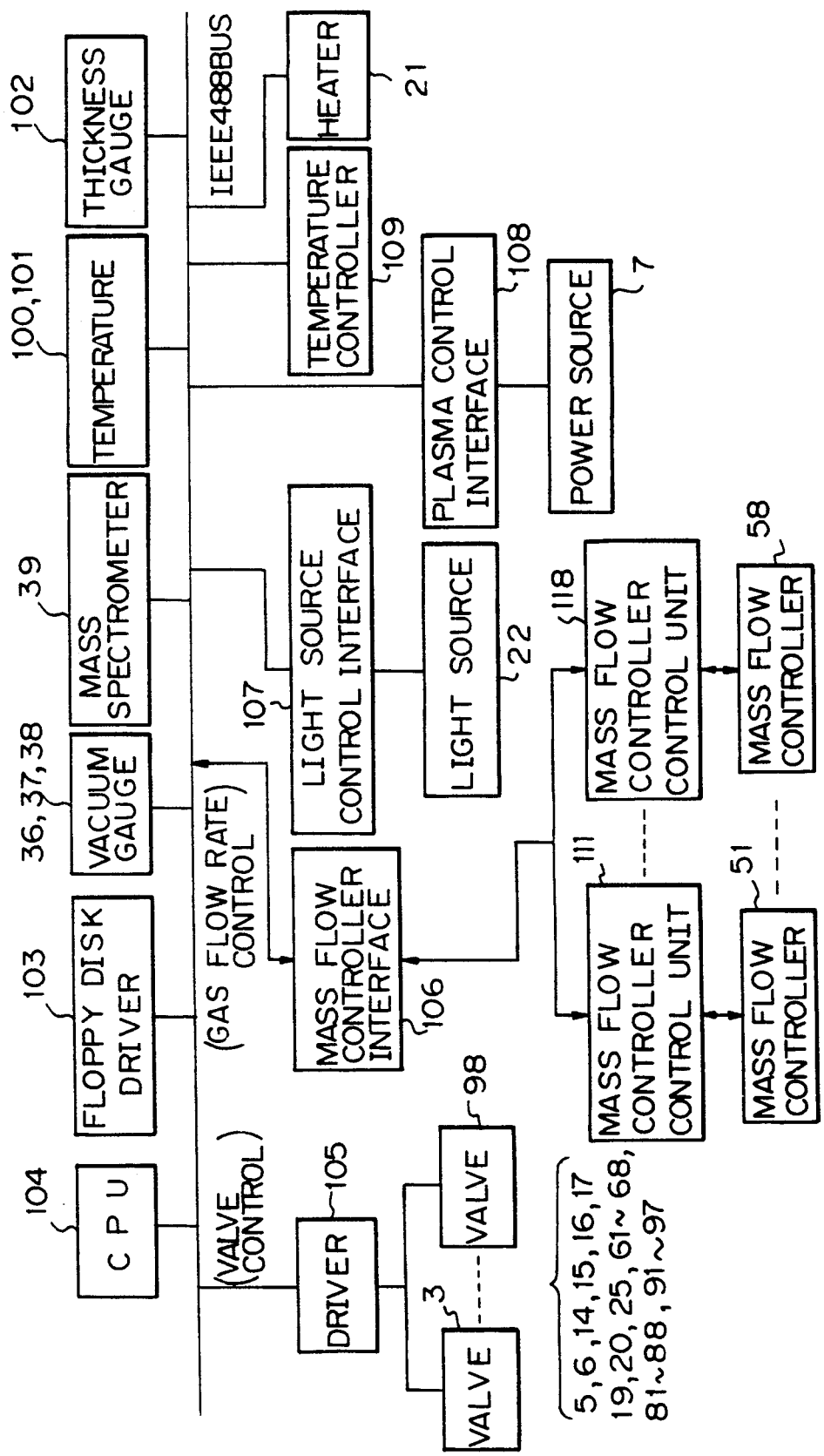
FIG. 4 is an illustration showing one example of the controller for system control.
Figure 7:
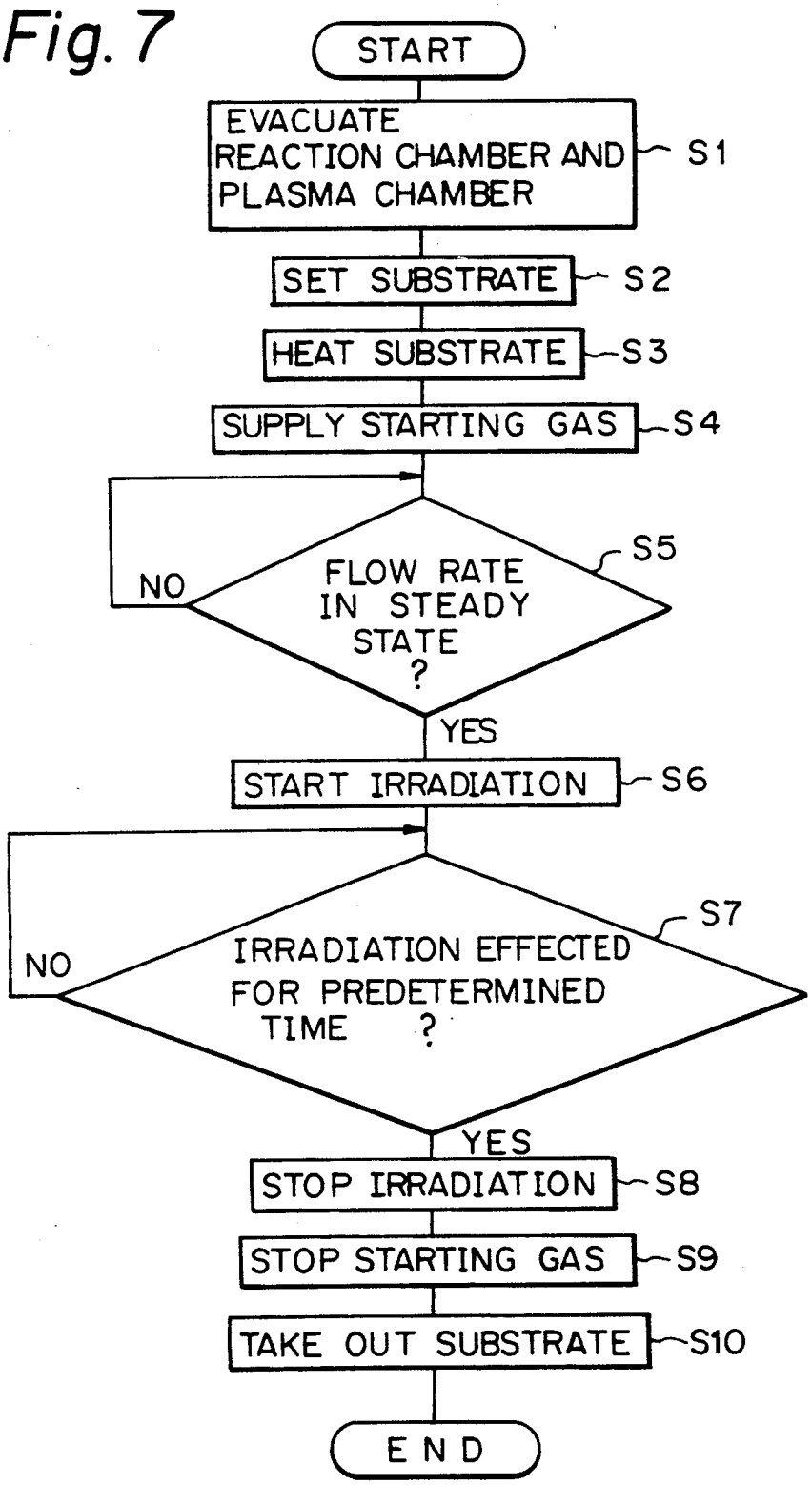
FIGS. 7, 8 and 9 are flow charts showing examples of film depositing procedure according to the present invention.
Figure 8:
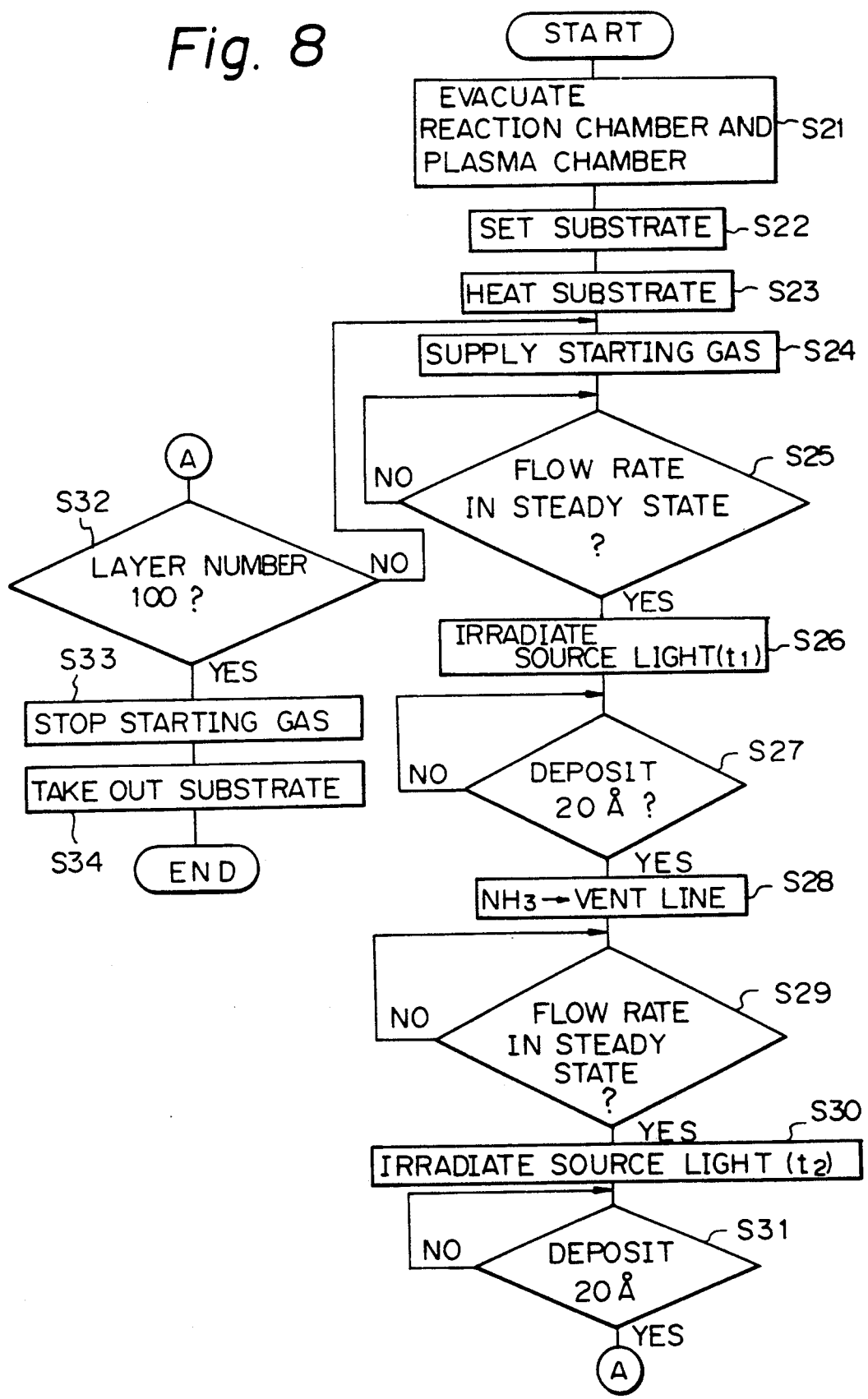
Figure 9:
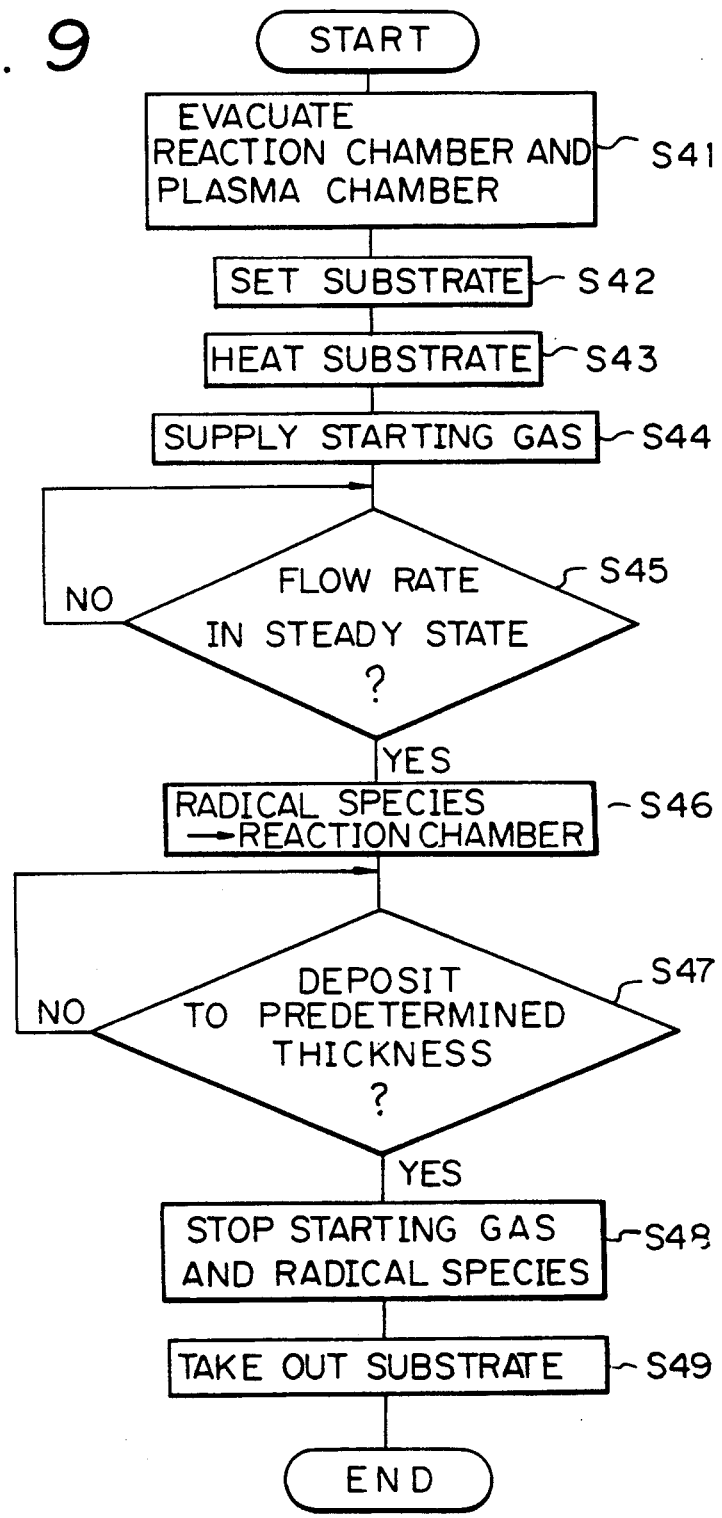

FIG. 4 shows one constitutional example of the controller for system control. The order of the actuations of the system as a whole, as shown in FIG. 7, FIG. 8, FIG. 9, is memorized previously in a floppy disk driver 103 as the external memory device, and this is read in the internal memory within the CPU 104. 105 is a driver for driving the respective valves by the command from CPU 104, and 106 is a mass flow controller interface, and 111–118 are control units for controlling the respective mass flow controllers by receiving the command from CPU 104 through the interface 106. The measured values of the flow rates of the gases flowing through the respective pipes 71–78 from the flow rate detecting means in the respective mass flow controllers 51–58 are inputted in CPU 104 through the respective units 111–118 and the interface 106.

107 is a light source control interface, and the light source 22 is controlled based on the command from CPU 104 through this interface. 108 is a plasma control interface, and the power source 7 is controlled based on the command from CPU 104 through this interface. 109 is a temperature control device comprising a resistance heater or an IR light source provided on the substrate holder, and the temperature of the substrate is controlled based on the command from CPU 104. The heater 21 is also controlled by CPU 104, similarly. The respective elements can be connected by means of, for example, IEEE 488 bus.

In such a constitution as described above, first deposition of a single layer film by use of the photolytic method is described by referring to FIG. 7.

First, in the step S1, the reaction chamber 1 and the plasma chamber 4 are evacuated. This is done as follows. With the stop valves 19, 20, 25 and 15, and the gate valve 3 being closed, while opening the stop valve 14, the throttle valve 17, the gate valves 6 and 13 and the variable orifice 5, the reaction chamber 1 and the plasma chamber 4 are brought to a pressure of about $10^{-7}$ Torr by means of the exhauster 8. During this operation, the reaction chamber 1 may be internally subjected to baking by a heater.

Next, in the step S2, the substrate as the supporting member is set in the reaction chamber 1. More specifically, first, by opening the lid at the upper portion of the preliminary chamber 2 the substrate is mounted on the substrate conveying mechanism 23 in the preliminary chamber 2 under atmospheric pressure, then the lid at the upper portion of the preliminary chamber 2 is closed and the stop valve 16 is opened, followed by evacuation of the preliminary chamber 2 by means of the exhauster 10 to a pressure of about $10^{-7}$ to $10^{-6}$ Torr. Subsequently, the gate valve 3 is opened, the substrate is conveyed from the preliminary chamber 2 to the reaction chamber 1 by means of the substrate conveying mechanism 23, then mounted on the substrate holder in the same chamber 1, and again the substrate conveying mechanism 23 is returned to the preliminary chamber 2, and the gate valve 3 is closed.

Next, in the step S3, the substrate in the reaction chamber 1 is heated internally to a desired temperature. The substrate temperature is set generally at 100° to 500° C., preferably 200° to 400° C. (temperature control is performed by referring to the measured value on the thermometer 101).

Next, in the step S4, the starting gas is supplied into the reaction chamber 1. That is, by opening the stop valve 20, at least one starting gas which is required is supplied from the gas supply 32 into the reaction chamber 1. During this operation, selection of the gas species and control of the gas flow rate can be done by control of the corresponding valves in the gas supply 32 and control of the corresponding mass flow controllers and by referring to the flow rate detected value, and also control of the gas temperature can be done by control of the heater 21 by referring to the measured value of the thermometer 100, if necessary.

Next, in the step S5, a judgment is made about whether the flow rate (pressure) of the starting gas supplied into the reaction chamber 1 has reached the steady state, and progress made to the step S6 on reaching the steady state to actuate the light source 22, whereby light with a desired intensity irradiates internally reaction chamber 1 to effect photolysis of the reaction gas in the reaction chamber 1. During this operation, since the reaction chamber 1 is exhausted by the exhauster 8 or 9, the pressure in the reaction chamber is maintained at the difference between the amount of the starting gas supplied and the exhausted amount.

Figure 5:
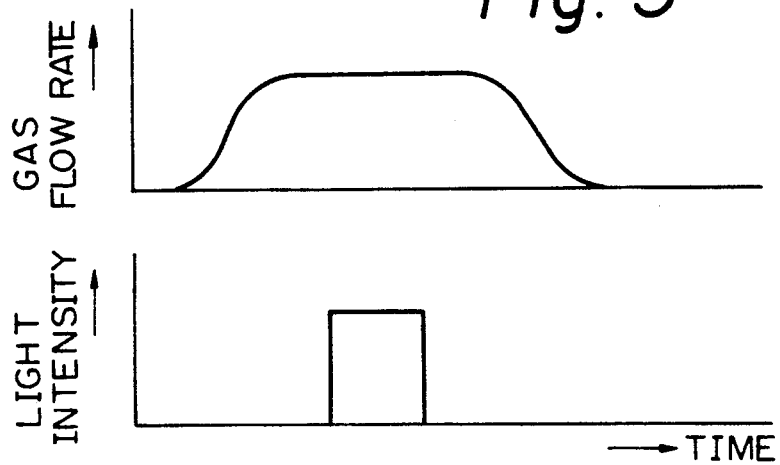
FIG. 5 and FIG. 6 are timing diagrams showing one example of the relationship between supplying of the starting gas and timing of light irradiation.

Next, in the step S7, a judgment is made about whether light irradiation has been conducted for a predetermined time and, on completion of irradiation for the predetermined time, progress made to the step S8 to discountinue light irradiation followed by stopping of the starting gas into reaction chamber 1 in the Step S9. The series of actuations are shown in the graphs in FIG. 5. Since the film thickness of the thin film decomposed by light irradiation and deposited on the substrate depends on the kind of the gas, the gas flow rate, the gas pressure, the substrate temperature, the kind of light source, the light intensity and the time of light irradiation, and is an amount which can be known experimentally, a thin film with a desired film thickness can be prepared by inputting those parameters previously into the memory in the CPU of the controller for system control. Particularly, since the amount of the thin film deposited is substantially proportional to the light irradiation time, even a thin film of about some 10 Å can be deposited on the substrate with good controllability by changing the light irradiation time without changing other conditions.

Next, in the step S10, the substrate after deposition of the thin film is taken out. More specifically, the reaction chamber 1 is again brought to a pressure of about $10^{-7}$ Torr to $10^{-6}$ Torr, and then the substrate is returned by means of the substrate conveying mechanism 23 to the preliminary chamber 2 by opening the gate valve 3. The gate valve 3 is closed and thereafter the preliminary chamber 2 is returned to atmospheric pressure, and the substrate attached with the deposited film is taken out.

Referring now to FIG. 8, the procedure for depositing a non-single crystalline semiconductor multi-layer film on the substrate is to be described. Here, as an example, description is made of the case of laminating alternately hydrogenated amorphous silicon and hydrogenated amorphous silicon nitride on a substrate. For realizing the quantum size effect, the thickness of each layer is made 20 Å and 100 layers as the total, 50 layers for each material, are laminated. As the substrate, silicon wafer is used.

As shown in FIG. 8, the substrate is placed at the predetermined position in the reaction chamber 1, and the process for heating (step S21-S23) is the same as described above with reference to FIG. 7.

Next, in the step S24, a starting gas is supplied to the reaction chamber 1. The starting gases employed are three kinds of disilane ($Si_2H_6$), hydrogen ($H_2$) and ammonia ($NH_3$). The gas temperature is controlled to 100°-200° C. Control of the starting gas is described by referring to FIG. 6. First, by permitting $Si_2H_6$ and $NH_3$ to flow towards the side of the gas supplying pipe 18 from the vent line 90 by control of the three-way valve on the farthermost downstream side of the line, these gases are mixed. During this operation, the mixing ratio of the gases can be made variable by controlling the flow rates by means of the mass flow controllers of the respective lines. Here, for example, $Si_2H_6$ is permitted to flow at 0.5 SCCM, $H_2$ at 10 SCCM and $NH_3$ at 50 SCCM.

Next, in the step S25, a judgment is made about whether the flow rates of the starting gases supplied into the reaction chamber 1 have reached steady states, and, on reaching the steady states, progress is made to the step S26 to effect irradiation of light from a light source, for example, by using a low pressure mercury lamp in the reaction chamber 1 for the time of $t_1$, and a judgment is made about whether hydrogenated amorphous silicon nitride with a thickness of 20 Å has been deposited on the substrate based on the measured value by a film thickness measuring instrument in the step S27. If the film has been deposited to 20 Å, the process advances to the step S28, and the three-way valve on the farthest downstream side of the $NH_3$ line is changed toward the vent line 90 so that no $NH_3$ flows into the starting gas. Next, in the step S29, a judgment is made about whether the flow rates of the starting gas have reached steady state and, on reaching steady state, progress is made to the step S30, and light from the light source is irradiated for the time of $t_2$. Then, progressing to the step S31, a judgment is made about whether hydrogenated amorphous silicon with a thickness of 20 Å has been deposited on the substrate (the values of the above $t_1$ and $t_2$ can be determined by preparing previously single layer films and calculating in proportion to the light irradiation time and a film thickness deposited). On reaching 20 Å, progress is made to the step S32 and judgment is made about whether the number of the thin films laminated is 100. If the layer number is 100, progress is made to the step S33, while if it is not 100, by returning to the step S24, hydrogenated amorphous silicon nitride of 20 Å is deposited, followed further by deposition of hydrogenated amorphous silicon of 20 Å thereon.

And, when the number of thin films laminated has reached 100 in the step S32, progress is made to the step S33 and supplying of the starting gas into the reaction chamber 1 is stopped. Next, progressing to the step S34, the substrate after deposition of the thin films is taken out as described above (see FIG. 6).

As described above, a non-single crystalline semiconductor multi-layer film of desired characteristics can be automatically prepared on a substrate following the program previously designed.

One specific feature of the present invention resides in performing all of the flow rate control, the gas mixing, the temperature control and the above series of operations automatically by a controller for system control, whereby the thickness of each layer of the multi-layer film can be also controlled accurately.

Here, description has been made by referring to an example of a multi-layer film using hydrogenated amorphous silicon and hydrogenated amorphous silicon nitride. Further, it is also possible to carry out the case of using a plural kinds of gases or the case of laminating different deposited films of 3 plurality of kinds or more according to the same procedure as described above.

Next, by referring to FIG. 9, the procedure of depositing a non-single crystalline semiconductor thin film on a substrate by decomposition of the starting gases in the reaction chamber 1 by use of radical species generated in the plasma chamber 4 in place of photolysis by means of the device shown in FIG. 1 will to be described.

The steps of placing a substrate at the predetermined position in the reaction chamber 1, supplying starting gases having a suitable mixing ratio depending on the film to be deposited into the reaction chamber 1, and judging whether the gases supplied into the reaction chamber 1 have reached steady state the steps S41-S45) are the same as the steps S1-S5 as described above.

In the step S45, when the starting gases supplied into the reaction chamber 1 have reached steady state, progress is made to the step S46 and the radical species generated in the plasma chamber 4 are diffused through the gate valve 5 and the variable orifice 6 into the reaction chamber 1. For generation of plasma in the plasma chamber 4, reaction gases such as Ar, $H_2$, $CF_4$ are delivered into the plasma chamber 4 through the gas supplying pipe 24, and power is supplied from the power source 7 of RF or microwave into the plasma chamber 4 to effect discharging in the plasma chamber 4. By this operation, the radical species of long life generated in the plasma chamber 4 can be diffused through the gate valve 5 and the variable orifice 6 into the reaction chamber 1. During this operation, the ion species are attracted to the discharging electrode in the plasma chamber 4, and therefore only neutral radical species can be taken out. And, the starting gas supplied from the gas supplying pipe 18 into the reaction chamber 1 are decomposed by the energy possessed by the radical species to be deposited on the substrate. Since the starting gases are decomposed not by the ion species but by the radical species, the surface of the deposited film will not be roughened. The flow of the radical species can be controlled by use of the gate valve 5 and the variable orifice 6.

Next, in the step S47, a judgment is made about whether the deposited film with a predetermined thickness has been formed on the substrate. When the deposited film is formed to a desired thickness, supply of the starting gases and the radical species into the reaction chamber 1 is stopped in the step S48 and then, progressing to the step S49, the substrate is taken out as described above.

It is also possible to use in combination the light source as described above and the discharging in the plasma chamber 4.

In the above examples, during preparation of the deposited film on the substrate by photolysis, in place of supplying directly the starting gases into the reaction chamber 1, they can be supplied through the stop valve 19, the plasma chamber 4, the gate valve 5, and the variable orifice 6, whereby the flow of said starting gases can be made laminar flow and uniform.

The film may be sometimes deposited also on the light incident window of the reaction chamber 1 to lower transmittance of light. Even in such a case, it is possible to effect etching of the inner surface of the window by discharging an etchable reaction gas in the plasma chamber 4 and permitting the discharged product to flow into the reaction chamber 1 through the gate valve 5 and the variable orifice. Alternatively, it is also possible to effect etching of the inner surface of the window by introducing an etchable gas directly into the reaction chamber 1 and causing optical etching reaction by use of the light source 22.

Figure 6:
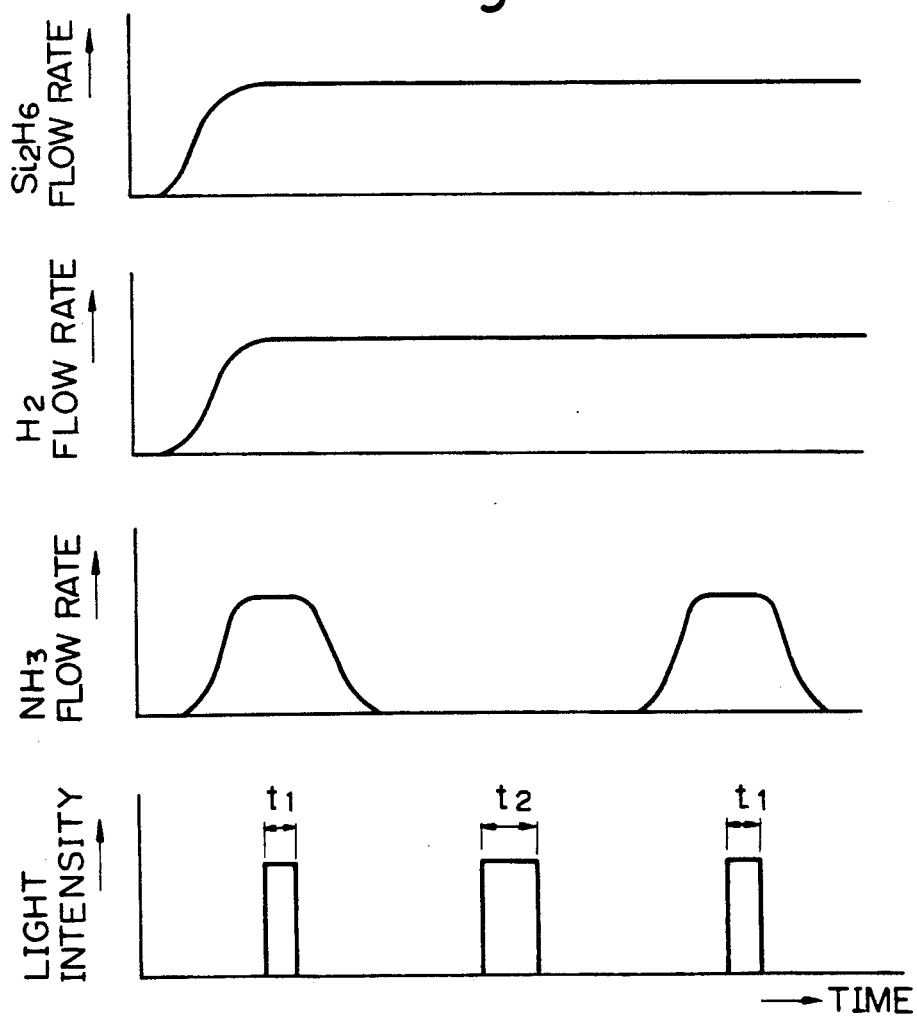

Also, in the above examples, during preparation of a multi-layer thin film of hydrogenated amorphous silicon and hydrogeneted amorphous silicon nitride, it is possible to control the flow of the gas mixture as a matter of course by permitting all of the reaction gases to flow intermittently, although a description has been given of the case in which a part of the reaction gases, namely $Si_2H_6$ and $H_2$ flow continuously and only $NH_3$ intermittently as shown in FIG. 6. Further, in the present invention, other than the multi-layer film comprising a non-single crystalline semiconductor, a multi-layer film comprising an insulating material and/or a metal can be prepared by selecting the materials appropriately. Thus, the present invention is not limited in the kind of the film to be deposited.

Referring now to FIG. 8, another procedure for depositing a non-single crystalline semiconductor multi-layer film on a substrate is described. Here, the case of laminating alternately hydrogenated amorphous silicon and hydrogenated amorphous silicon nitride on a substrate similarly as the above example is considered. Also, for realizing the quantum size effect, similarly as described above, the thickness of each layer is made 20 Å, 100 layers as the total with 50 layers for each material are laminated, and silicon wafer is used as the substrate.

As shown in FIG. 8, the steps of placing the substrate at the predetermined position in the reaction chamber 1 and heating (steps S21–S23) are the same as described above.

Next, in the step S24, starting gases are supplied into the reaction chamber. The starting gases employed are the three kinds of disilane ($Si_2H_6$), hydrogen ($H_2$) and ammonia ($NH_3$). The gas temperature is made 100° to 200° C. Control of the starting gases is described following FIG. 10. First, $Si_2H_6$ and $NH_3$ are permitted to flow from the vent line 90 to the gas supplying pipe 18 side by controlling the three-way valves at the farthest downstream side of the respective lines, thereby mixing these gases. During this operation, the mixing ratio of the gases can be made variable by controlling the flow rates of the mass flow controllers in the respective lines. Here, for example $Si_2H_6$ is permitted to flow at 3 SCCM and $NH_3$ at 60 SCCM. Also, $H_2$ at 20 SCCM is supplied from the supplying pipe 24 into the plasma chamber 4, from which it flows through the gate valve 5 and the variable orifice 6 into the reaction chamber 1.

Figure 10:
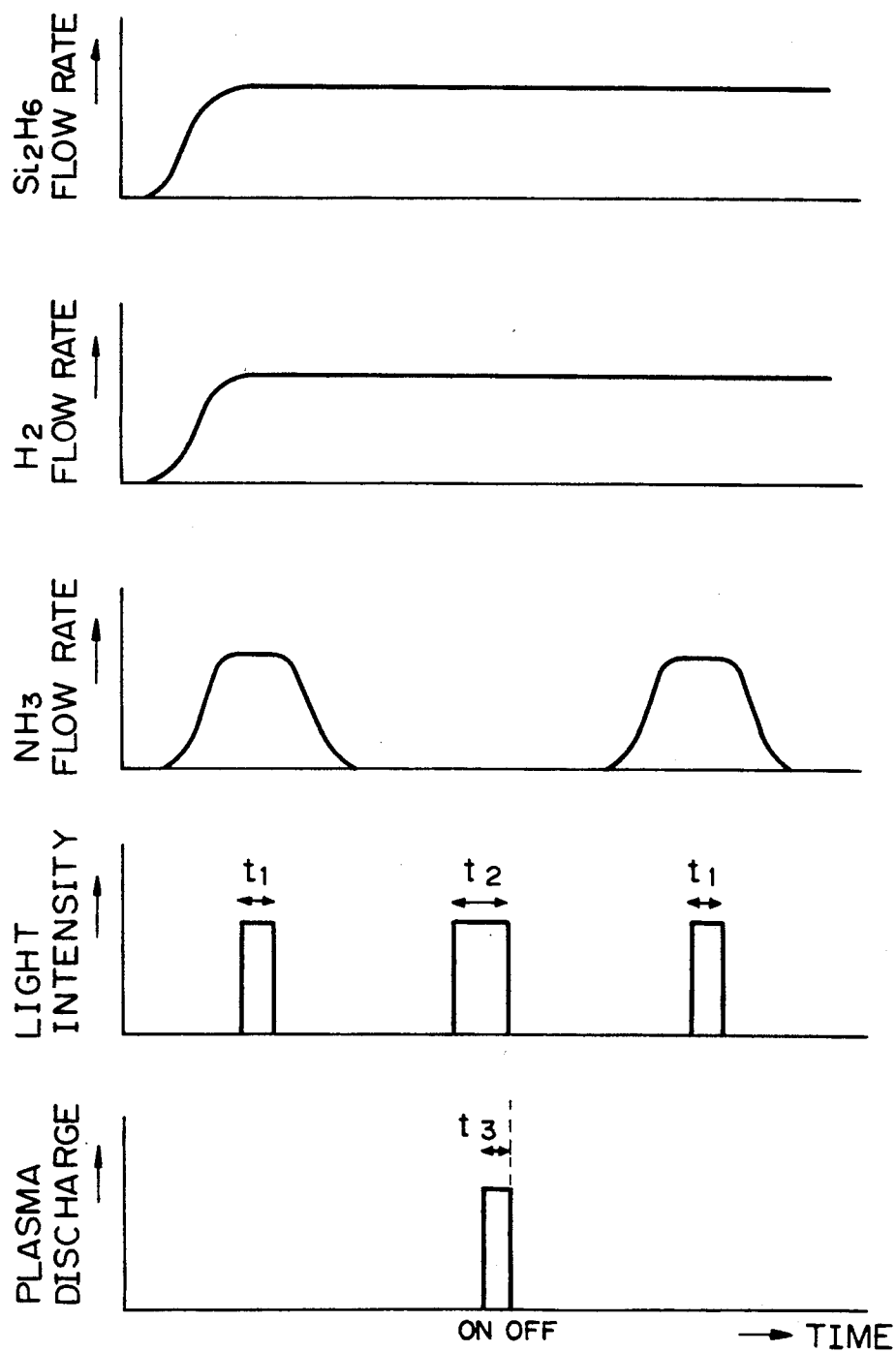
FIG. 10, FIG. 11, FIG. 13, FIG. 15 and FIG. 16 are each timing diagram showing an example of the relationship between supplying of the starting gas timing of light irradiation.

Next, in the step S25, judgement is made about whether the flow rates of the starting gases supplied into the reaction chamber 1 have reached steady state and, on reaching steady state, progress made to the step S26 where light from a light source, for example, a low pressure mercury lamp is irradiated in the reaction chamber 1 for the time $t_1$, and then in the step S27, a judgement is made about whether hydrogenated amorphous silicon nitride of 20 Å has been deposited based on the measured value by means of a film thickness measuring instrument. When the film has been deposited to 20 Å, progress is made to the step S28 and the three-way valve at the farthest downstream side of the $NH_3$ line is changed to the vent line 90 so that no $NH_3$ may flow into the starting gases. Next, in the step S29, a judgment is made about whether the starting gas flow rates have reached steady state, if reached, progress made to the step S30 and the light from a light source is irradiated for the time of $t_2$. Further, at a timing as shown in FIG. 10, power is inputted into the plasma chamber 4 from a power source 7 of RF or microwave for the time of $t_3$ to effect discharging simultaneously with diffusion of the radical species generated through the gate valve 5 and the variable orifice 6 into the reaction chamber 1, whereby the starting gas supplied from the gas supply 18 into the reaction chamber 1 is decomposed by light energy and also by the energy possessed by the radical species to be deposited on the substrate. Since the starting gases are decomposed not by ion species but by radical species, the surface of the deposited layer will not be roughened. The flow of the radical species is controlled by use of the gate valve 5 and the variable orifice 6.

Progressing next to the step S31, a judgment is made about whether hydrogenated amorphous silicon of 20 Å has been deposited on the substrate (the values of the above $t_1$, $t_2$ and $t_3$ can be determined by preparing previously single layer films and calculating in proportion to the light irradiation time and the film thickness deposited). On reaching 20 Å, progressing to the step S32, a judgment is made about whether the number of the films laminated is 100. If it is 100, progress is made to the step S33 or, if it is not 100, returning to the step S24, hydrogenated amorphous silicon nitride of 20 Å is deposited, followed further by deposition of hydrogenated amorphous silicon of 20 Å thereon.

And, if the number of thin films laminated has reached 100 in the step S32, progress is made to the step S33 and supplying of the starting gases into the reaction chamber 1 is stopped. Progressing next to the step S34, the substrate after deposition of the thin film is taken out similarly as described above (see FIG. 10).

As described above, a desired non-single crystalline semiconductor multi-layer film can be automatically prepared on a substrate.

In the above examples, during preparation of the deposited film on the substrate by photolysis, in place of supplying the starting gases directly into the reaction chamber 1, they can be supplied through the stop valve 19, the plasma chamber 4, the gate valve 5 and the variable orifice 6, whereby the flow of said starting gases can be made laminar flow and uniform.

Also, film may be sometimes deposited on the light incident window of the reaction chamber 1 to lower transmittance of light. Even in such a case, it is possible to effect etching of the inner surface of the window by discharging an etchable reaction gas within the plasma chamber 4 and permitting the discharged product through the gate valve and the variable orifice into the reaction chamber. Alternatively, it is also possible to effect etching of the inner surface of the window by introducing an etchable gas directly into the reaction chamber 1 and causing photoetching reaction to occur by use of a light source 22.

Referring now to FIG. 8, still another procedure for depositing a non-single crystalline semiconductor multilayer film on a substrate is to be described. Here, similarly as described above, the case of laminating hydrogenated amorphous silicon and hydrogenated amorphous silicon nitride alternately on a substrate is considered. Also, for realizing the quantum size effect, the thickness of each layer is made 20 Å, and 100 layers as the total with 50 layers for each material are laminated. As the substrate, silicon wafer is used.

As shown in FIG. 8, the steps of placing the substrate at a predetermined position in the reaction chamber 1 and heating the substrate (steps S21-S23) are the same as described above.

Figure 11:
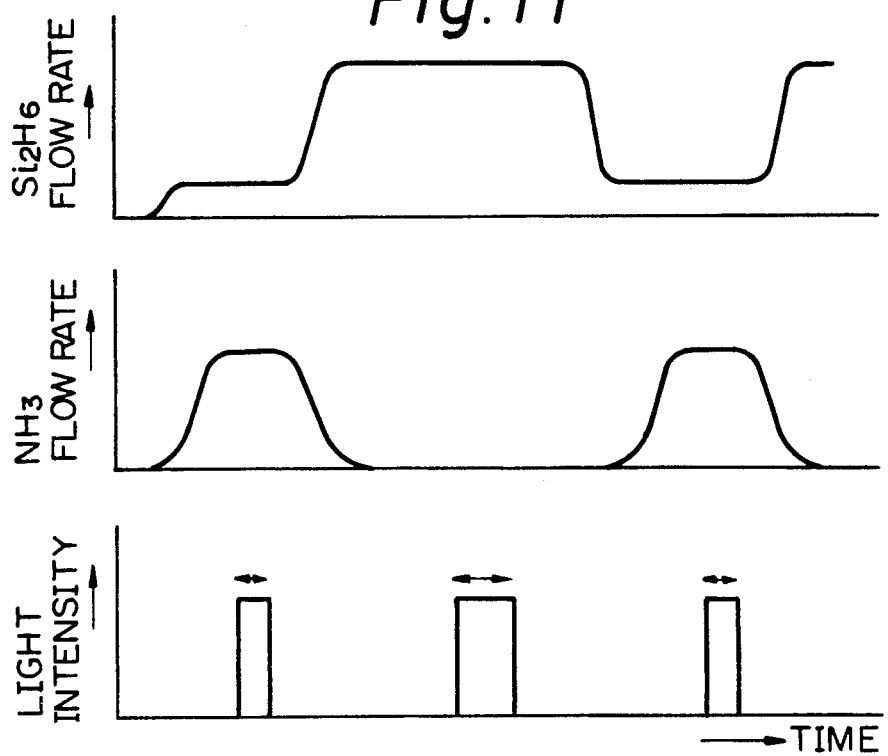

Next, in the step S24, starting gases are supplied into the reaction chamber 1. The starting gases employed are two kinds of disilane ($Si_2H_6$) and ammonia ($NH_3$). The gas temperature is made 100°-200° C. Description about control of the starting gases is made following FIG. 11. First, $Si_2H_6$ and $NH_3$ are permitted to flow from the vent line 90 to the gas supplying pipe 18 side by controlling the three-way valves at the farthest downstream side of the respective lines, thereby mixing these gases. During this operation, the mixing ratio of the gases can be made variable by control of the flow rates by the mass flow controllers in the respective lines. Here, for example, $Si_2H_6$ is permitted to flow at 0.5 SCCM, and $NH_3$ at 50 SCCM.

Next, in the step S25, a judgment is made about whether the flow rates of the starting gases supplied into the reaction chamber 1 have reached steady state, and on reaching steady state, progress made to the step S26 where a light from a light source such as a low pressure mercury lamp is irradiated in the reaction chamber 1 for the time of $t_1$, and then a judgment is made about whether hydrogenated amorphous silicon nitride of 20 Å has been deposited based on the measured value by a film thickness measuring instrument in the step S27. If deposited to 20 Å, progress is made to the step S28 and the three-way valve at the farthest downstream side of the $NH_3$ line is changed to the vent line 90 so that no $NH_3$ may flow into the starting gas ($Si_2H_6$). Next, in the step S29, $Si_2H_6$ is permitted to flow at 60 SCCM and judgment is made in the step S30 whether the starting gas flow rate has reached steady state and, if reached, progress made to the step S31 where light is irradiated from the light source for the time of $t_2$, followed further by progressing to the step S32, where a judgment is made about whether hydrogenated amorphous silicon of 20 Å has been deposited on the substrate (the values of the above $t_1$ and $t_2$ can be determined by preparing previously single layer films and calculating in proportion to the light photoirradiation time and a film thickness deposited). On reaching 20 Å, progress is made to the step S33 and a judgment is made about whether the number of the thin film laminated is 100. If it is 100, progress is made to the step S34, or if it is not 100, returning to the step S24, hydrogenated amorphous silicon nitride of 20 Å is deposited, followed further by deposition of hydrogenated amorphous silicon of 20 Å thereon.

And, when the number of thin film laminated has reached 100 in the step S33, progress is made to the step S34 and supplying of the starting gas into the reaction chamber 1 is stopped. Progressing next to the step S35, the substrate after deposition of the thin film is taken out similarly as described above (see FIG. 11).

FIG. 12 shows the constitution of another device for forming deposited film according to the present invention.

In FIG. 12, 1201 is a reaction chamber, and 1202 is a preliminary chamber connected through a gate valve 1203 to the reaction chamber 1201.

1208, 1209 and 1210 are exhausters for for exhaustion from the reaction chamber 1201 and the preliminary chamber 1202, respectively. The exhauster 1209 is connected through an exhausting pipe 1211 to the reaction chamber 1201, the exhauster 1208 through exhausting pipes 1220 and 1211 to the reaction chamber 1201, and the exhauster 1210 through an exhausting pipe 1212 to the preliminary chamber 1202. Particularly, in order that the exhausting capacity can be controlled depending on the pressure in the reaction chamber 1201 and the flow rate of the reaction gas required during formation of deposited film the exhauster 1208 should be preferably be a turbomolecular pump or a combination of a diffusion pump with a rotary pump, and the exhauster 1209 preferably be a combination of a mechanical booster pump with a rotary pump.

1217 is a throttle valve provided at the exhausting pipe 1211, 1215 a stop valve provided at the exhausting pipe 1211 on the downstream side of the valve 1217. The exhausting pipe 1220 is connected to the exhausting pipe 1211 between the two valves 1215 and 1217. 1214 is a stop valve provided at the exhausting pipe 1220, and 1216 is a stop valve provided at the exhausting pipe 1212.

1232 is a starting gas supply, and the starting gas from this gas supply is fed through a supplying pipe 1218 to reaction chamber 1201, and also through a vent line 1290 to the exhausting pipe 1220 on the upstream side of the stop valve 1214. 1213 is a stop valve provided at a supplying pipe 1218.

1222 is a light source for photolysis of the reaction gas introduced into the reaction chamber 1201, and the light is permitted to enter the reaction chamber 1201 through a window provided at the chamber. Specific examples of the light source 1222 may include low pressure mercury lamp, Xe lamp, Xe-Hg lamp, excimer laser, argon laser, Nd-YAG laser and $CO_2$ laser similarly as in the case of the device shown in FIG. 1.

1207 is a contoller for system control and controls the gas supply 1232, the light sourced 1222 and the respective valves (details are described hereinafter).

1223 is a substrate conveying mechanism which is driven by oil pressure, etc., and conveys the substrate between the preliminary chamber 1202 and the reaction chamber 1201.

1235 and 1236 are vacuum gauges and measure the degree of vacuum in the reaction chamber 1201 and the preliminary chamber 1202, respectively.

1239 is a mass analyzer for measuring the concentrations of the starting materials in the reaction chamber 1201, and 12101 is a thermometer for measuring the temperature of the supporting member (substrate) on which a thin film is deposited, being specifically constituted of a thermocouple mounted on a substrate holder (not shown) arranged in the reaction chamber 1201 (the substrate temperature can also be estimated by measuring, for example, the temperature of the substrate holder). 12102 is a film thickness measuring instrument for measuring the thickness of the thin film deposited on the substrate, typically, for example, an ellipsometer. etc.

As the gas supply for supplying starting gases to the reaction chamber 1201, the gas supply system as described by referring to FIG. 2 can be used.

One constitutional example of the controller for system control and the procedure of actuations of the system as a whole in the case of forming a film by use of the device in FIG. 12 are shown in FIG. 4, FIG. 7 and FIG. 8.

By means of the device shown in FIG. 12, first, deposition of a single layer film by use of the photolytic method is described by referring to FIG. 7.

First, in the step S1, the reaction chamber 1201 is evacuated. This is done as follows. With the stop valves 1213, 1215 and the gate valve 1203 being closed, while opening the stop valve 1214, the throttle valve 1217, the reaction chamber is brought to a vacuum degree of about $10^{-7}$ Torr by means of the exhauster 1208. During this operation, the reaction chamber 1201 may be internally subjected to baking by a heater.

Next, in the step S2, the substrate as the supporting member is set in the reaction chamber 1201. More specifically, first, by opening the lid at the upper portion of the preliminary chamber 1202, the substrate is mounted on the substrate conveying mechanism 1223 in the preliminary chamber 1202 under atmospheric pressure, then the lid at the upper portion of the preliminary chamber 1202 is closed and the stop valve 1216 is opened, followed by evacuation of the preliminay chamber 1202 by means of the exhauster 1210 to a vacuum degree of about $10^{-7}$ to $10^{-6}$ Torr. Subsequently, the gate valve 1203 is opened, the substrate is conveyed from the preliminary chamber 1202 to the reaction chamber 1201 by means of the substrate conveying mechanism 1223, then mounted on the substrate holder in the same chamber 1201, and again the substrate conveying mechanism 1223 is returned to the preliminary chamber 1202, and the gate valve 1203 is closed.

Next, in the step S3, the substrate in the reaction chamber 1201 is heated to a desired temperature. The substrate temperature is set generally at 100° to 500° C., preferably 200° to 400° C. (temperature control is performed by referring to the measured value on the thermometer 12101).

Next, in the step S4, the starting gas is supplied into the reaction chamber 1201. That is, by opening the stop valve 1213, at least one starting gas which is required is supplied from the gas supply 1232 into the reaction chamber 1201. During this operation, selection of the gas species and control of the gas flow rate can be done by control of the corresponding valves in the gas supply 1232 and control of the corresponding mass flow controllers and by referring to the flow rate detected value.

Next, in the step S5, a judgment is made about whether the flow rate (or pressure) of the starting gas supplied into the reaction chamber 1201 has reached the steady state, and progress is made to the step S6 on reaching the steady state to actuate the light source 1222, whereby light with a desired intensity is internally irradiates the reaction chamber 1201 to effect photolysis of the reaction gas in the reaction chamber 1201. During this operation, since the reaction chamber 1201 is exhausted by the exhauster 1208 or 1209, the pressure in the reaction chamber is maintained by the difference between the amount of the starting gas supplied and the exhausted amount.

Next, in the step S7, a judgment is made about whether light irradiation has been conducted for a predetermined time and, on completion of irradiation for the predetermined time, the process advances to the step S8 to discontinue light irradiation followed by stopping of the feed of the starting gas into the reaction chamber 1201 in the step S9 (this is done by switching the three-way valves at the farthermost downstream side of the lines for respective gases in the gas supply 1232 to the vent line 1290 side). The series of actuations are shown in the graphs in FIG. 5. Since the film thickness of the thin film decomposed by light irradiation and deposited on the substrate depends on the kind of the gas, the gas flow rate, the gas pressure, the substrate temperature, the kind of light source, the light intensity and the time of irradiation and is an amount which can be known experimentally, a thin film with a desired film thickness can be prepared by inputting those parameters previously into the memory in the CPU of the controller for system control. Particularly, since the amount of the thin film deposited is substantially proportional to the irradiation time, even a thin film of about some 10 Å can be deposited on the substrate with good controllability and without roughening of the surface by changing the light irradiation time without changing other conditions.

Next, in the step S10, the substrate after deposition of the thin film is taken out. More specifically, the reaction chamber 1201 is again brought to a vacuum degree of about $10^{-7}$ Torr to $10^{-6}$ Torr, and then the substrate is returned by means of the substrate conveying mechanism 1223 to the preliminary chamber 1202 by opening the gate valve 1203. The gate valve 1203 is closed and thereafter the preliminary chamber 1202 is returned to atmospheric pressure, and the substrate attached with the deposited film is taken out.

Referring now to FIG. 8, the procedure for depositing a non-single crystalline semiconductor multi-layer film on the substrate is to be described. Here, as an example, description is made of the case of laminating alternately hydrogenated amorphous silicon and hydrogenated amorphous silicon nitride on a substrate. For realizing the quantum size effect, the thickness of each layer is made 20 Å and 100 layers as the total, 50 layers for each material, are laminated. As the substrate, silicon wafer is used.

As shown in FIG. 8, the substrate is placed at the predetermined position in the reaction chamber 1201, and the process for heating (step S21-S23) is the same as described above.

Next, in the step S24, starting gases are supplied to the reaction chamber 1201. The starting gases employed are three kinds of gases including disilane ($Si_2H_6$), hydrogen ($H_2$) and ammonia ($NH_3$). The gas temperature is controlled to 100°-200° C. Control of the starting gas is described by referring to FIG. 13. First, by permitting $Si_2H_6$ and $N_3$ on the side of the gas supplying pipe 1218 from the vent line 1290 by control of the three-way valve on the farthermost downstream side of the line, thereby mixing these gases. During this operation, the mixing ratio of the gases can be made variable by controlling the flow rates by means of the mass flow controllers of the respective lines. Here, for example, $Si_2H_6$ is permitted to flow at 0.5 SCCM, $H_2$ at 10 SCCM and $NH_3$ at 50 SCCM.

Next, in the step S25, a judgment is made about whether the flow rates of the starting gases supplied into the reaction chamber 1201 have reached steady states, and, on reaching the steady states, the process advances to the step S26 to effect irradiation of light from a light source, for example, a low pressure mercury lamp in the reaction chamber 1201 for the time of $t_1$, and a judgement is made about whether hydrogenated amorphous silicon nitride with a thickness of 20 Å has been deposited on the substrate based on the measured value by a film thickness measuring instrument in the step S27. If the film has been deposited to 20 Å, the process advances to the step S28, and the three-way valve on the farthermost downstream side of the $NH_3$ line is changed toward the vent line 1290 so that no $NH_3$ flows into the starting gas. Next, in the step S29, a judgement is made about whether the flow rates of the starting gas have reached steady state and, on reaching steady state, the process advances to the step S30, and light from the light source is irradiated for the time of $t_2$. Then, in step S31, a judgement is made about whether hydrogenated amorphous silicon with a thickness of 20 Å has been deposited on the substrate (the values of the above $t_1$ and $t_2$ can be determined by preparing previously single layer films and calculating in proportion to the light irradiation time and a film thickness deposited). On reaching 20 Å, the process advances to the step S32 and judgement is made about whether the number of the thin films laminated is 100. If the layer number is 100, then the process advances to the step S33, while if it is not 100, by returning to the step S24, hydrogenated amorphous silicon nitride of 20 Å is deposited, followed further by deposition of hydrogenated amorphous silicon of 20 Å thereon.

And, when the number of thin films laminated has reached 100 in the step S32, the process advances to the step S33 and supplying of the starting gas into the reaction chamber 1 is stopped. Next, in the step S34, the substrate after deposition of the thin films is taken out as described above (see FIG. 13).

As described above, a non-single crystalline semiconductor multi-layer film can be automatically prepared on a substrate following the program previously designed.

Figure 14:
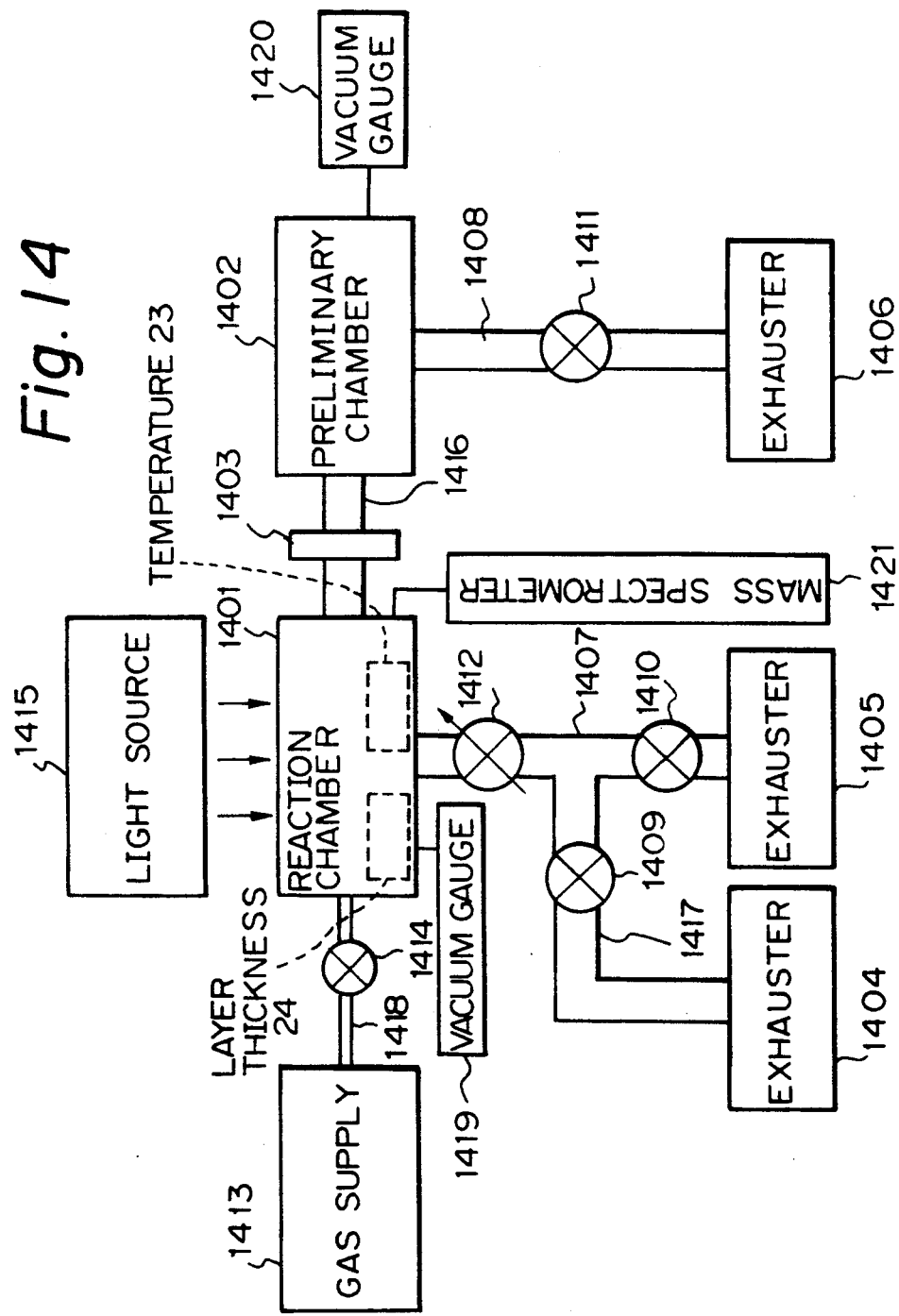

FIG. 14 shows the constitution of still another example of the device of forming deposited film according to the present invention.

In FIG. 14, 1401 is a reaction chamber, and 1402 is a preliminary chamber connected continuously through a gate valve 1403 to the reaction chamber 1401.

1404, 1405 and 1406 are exhausters for exhaustion from the reaction chamber 1401 and the preliminary chamber 1402, respectively. The exhauster 1405 is connected through an exhausting pipe 1407 to the reaction chamber 1401, the exhauster 1406 through an exhausting pipe 1408 to the preliminary chamber 1402 and the exhauster 1404 through exhausting pipes 1417 and 1407 to the reaction chamber 1401. Particularly, in order that the exhausting capacity can be controlled depending on the pressure in the reaction chamber 1401 and the flow rate of the reaction gas required during formation of deposited film, one of the exhausters 1404 and 1405 should preferably be a turbomolecular pump or a combination of a diffusion pump with a rotary pump, and the other preferably be a combination of a mechanical booster pump with a rotary pump.

1412 is a throttle valve provided at the exhausting pipe 1407, 1410 a stop valve provided at the exhausting pipe 1407 on the downstream side of the valve 1412, and the exhausting pipe 1417 is connected to the exhausting pipe 1407 between the two valves 1410 and 1412. 1409 is a stop valve provided at the exhausting pipe 1417, and 1411 is a stop valve provided at the exhausting pipe 1408.

1413 is a starting gas supply, and the starting gas from this gas supply is fed through a supplying pipe 1418 into the reaction chamber 1401. 1414 is a stop valve provided in the course of the exhausting pipe 1418.

1415 is a light source for photolysis of the reaction gas introduced into the reaction chamber 1401, and the light is permitted to enter the reaction chamber 1401 though a window provided at the chamber. Specific examples of the light source 1415 may include low pressure mercury lamp, Xe lamp, Xe-Hg lamp, excimer laser, argon laser, Nd-YAG laser and $CO_2$ laser.

1416 is a substrate conveying mechanism which is driven by oil pressure, etc., and conveys the substrate between the preliminary chamber 1402 and the reaction chamber 1401.

1419 and 1420 are vacuum gauges for measuring the degree of vacuum in the reaction chamber 1401 and the preliminary chamber 1402, respectively.

1421 is a mass analyzer for measuring the concentrations of the starting material in the reaction chamber 1401. 1423 is a thermometer for measuring the temperature of the substrate on which a thin film is deposited, being specifically constituted of a thermocouple mounted on a substrate holder (not shown) arranged in the reaction chamber 1401 (the substrate temperature can also be estimated by measuring, for example, the temperature of the substrate holder). 1424 is a film thickness measuring instrument for measuring the thickness of the thin film deposited on the substrate, typically, for example, an ellipsometer, etc.

As the gas supply 1413 for supplying the starting gases into the reaction chamber 1401, the device as shown in FIG. 2 can be used.

In the case of forming a film by use of the device shown in FIG. 14, the conceptional illustration showing the kinds of control by the controller for system control and the input information for control, a constitutional example of the controller for system control and the procedure for actuation of the whole system are shown in FIG. 3, FIG. 4, FIG. 7, and FIG. 8, respectively.

In such a constitution as described above, first, deposition of a single layer film by use of the photolytic method is described by referring to FIG. 7.

First, in the step S1, the reaction chamber 1401 is evacuated. This is done as follows. With the stop valve 1410 being closed, while opening the stop valve 1409 and the throttle valve 1412, the reaction chamber 1401 is brought to a vacuum degree of about $10^{-7}$ Torr by means of the exhauster 1404. During this operation, the reaction chamber 1401 may be internally subjected to baking by a heater.

Next, in the step S2, the substrate as the supporting member is set in the reaction chamber 1401. More specifically, first, by opening the lid at the upper portion of the preliminary chamber 1402, the substrate is mounted on the substrate conveying mechanism 1416 in the preliminary chamber 1402 under atmospheric pressure, then the lid at the upper portion of the preliminary chamber 1402 is closed and the stop valve 1411 is opened, followed by evacuation of the preliminary chamber 1402 by means of the exhauster 1406 to a vacuum degree of about $10^{-7}$ to $10^{-6}$ Torr. Subsequently, the gate valve 1403 is opened, the substrate is conveyed from the preliminary chamber 1402 to the reaction chamber 1401 by means of the substrate conveying mechanism 1416, then mounted on the substrate holder in the same chamber 1401, and again the substrate conveying mechanism 1416 is returned to the preliminary chamber 1402, and the gate valve 1403 is closed.

Next, in the step S3, the substrate in the reaction chamber 1401 is heated to a desired temperature. The substrate temperature is set generally at 100° to 500° C., preferably 200° to 400° C. (temperature control is performed by referring to the measured value on the thermometer 1423).

Next, in the step S4, the starting gas is supplied into the reaction chamber 1401. That is, by opening the stop valve 1414, at least one starting gas which is required is supplied from the gas supply 1413 into the reaction chamber 1401. During this operation, selection of the gas species and control of the gas flow rate can be done by control of the corresponding valves in the gas supply 1413 and control of the corresponding mass flow controllers and by referring to the flow rate detected value.

Next, in the step S5, a judgement is made about whether the flow rate (or pressure) of the starting gas supplied into the reaction chamber 1401 has reached the steady state, and then the process advances to the step S6 on reaching the steady state to actuate the light source 1415, whereby light with a desired intensity internally irradiates the reaction chamber 1401 to effect photolysis of the reaction gas in the reaction chamber 1401. During this operation, since the reaction chamber 1401 is exhausted by the exhauster 1404 or 1405, the pressure in the reaction chamber is maintained by the difference between the amount of the starting gas supplied and the exhausted amount.

Next, in the step S7, a judgment is made about whether light irradiation has been conducted for a predetermined time and, on completion of irradiation for the predetermined time, the process advances to the step S8 to discontinue light irradiation followed by stopping of the supply of the starting gas into the reaction chamber 1 in the step S9. The series of actuations are shown in the graphs in FIG. 5. Since the film thickness of the thin film decomposed by light irradiation and deposited on the substrate depends on the kind of the gas, the gas flow rate, the gas pressure, the substrate temperature, the kind of light source, the light intensity and the time of light irradiation and is an amount which can be known experimentally, a thin film with a desired film thickness can be prepared by inputting those parameters previously into the memory in the CPU of the controller for system control. Particularly, since the amount of the thin film deposited is substantially proportional to the light irradiation time, even a thin film of about 10 Å can be deposited on the substrate with good controllability and without roughening of the surface by changing the irradiation time without changing other conditions.

Next, in the step S10, the substrate after deposition of the thin film is taken out. More specifically, the reaction chamber 1401 is again brought to a vacuum degree of about $10^{-7}$ Torr to $10^{-6}$ Torr, and then the substrate is returned by means of the substrate conveying mechanism 1416 to the preliminary chamber 1402 by opening the gate valve 1403. The gate valve 1403 is closed and thereafter the preliminary chamber 1402 is returned to atmospheric pressure, and the substrate attached with the deposited film is taken out.

Figure 13:
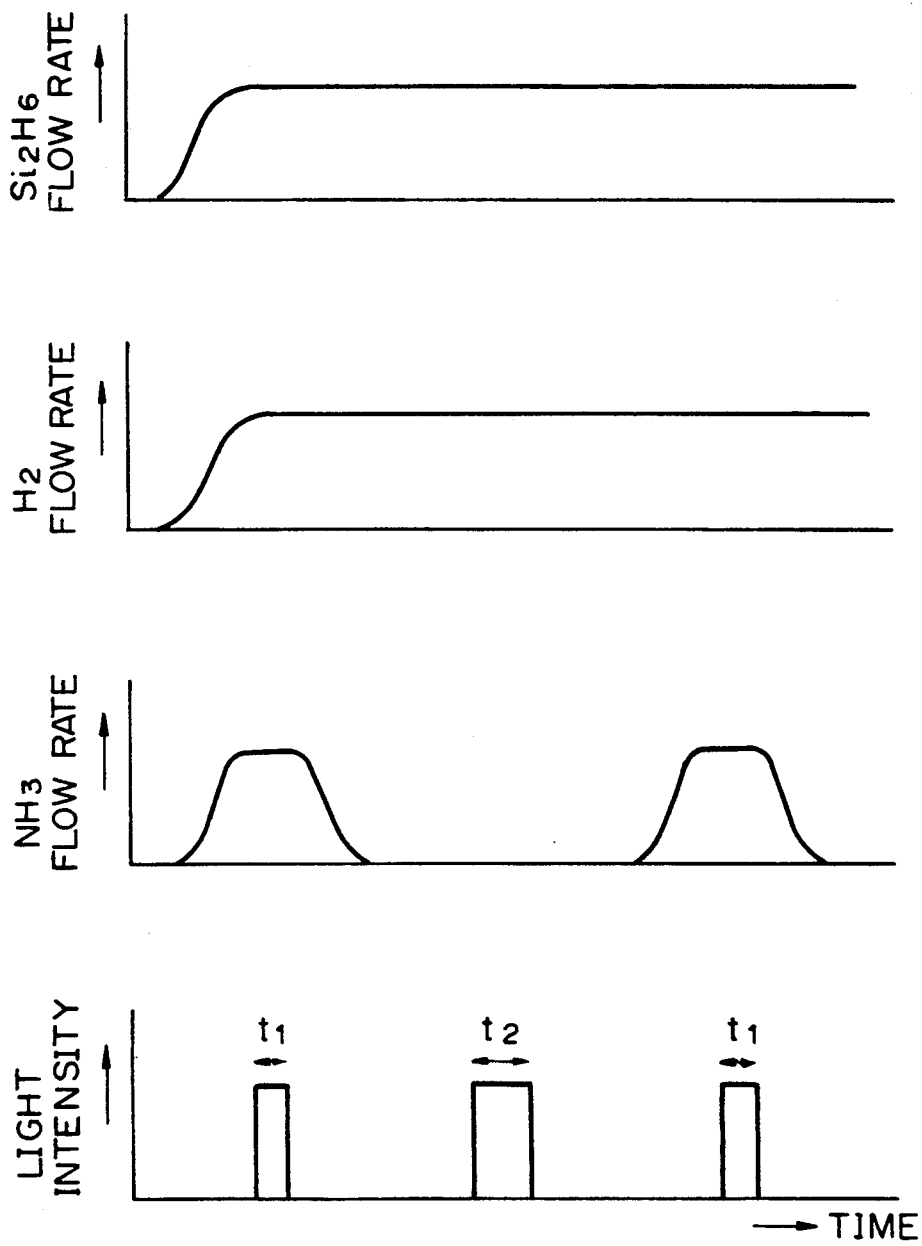

Referring now to FIG. 13, the procedure for depositing a non-single crystalline semiconductor multi-layer film on the substrate is to be described. Here, as an example, description is made about the case of laminating alternately hydrogenated amorphous silicon and hydrogenated amorphous silicon nitride on a substrate. For realizing the quantium size effect the thickness of each layer is made 20 Å and 100 layers as the total, 50 layers for each material, are laminated. As the substrate, silicon wafer is used.

As shown in FIG. 13, the substrate is placed at the predetermined position in the reaction chamber 1401, and the process for heating (step S21-S23) is the same as described above.

Next, in the step S24, starting gases are supplied to the reaction chamber 1401. The starting gases employed are three kinds of gases including dislane ($Si_2H_6$), hydrogen ($H_2$) and ammonia ($NH_3$). The gas temperature is controlled to 100°-200° C. Control of the starting gas is described by referring to FIG. 13. First, by permitting $Si_2H_6$, $H_2$ and $NH_3$ to flow on the side of the gas supplying pipe 1418 from the vent line 1490 by control of the three-way valve on the farthermost downstream side of the line, thereby mixing these gases. During this operation, the mixing ratio of the gases can be made variable by controlling the flow rates by means of the mass flow controllers of the respective lines. Here, for example, $Si_2H_6$ is permitted to flow at 0.5 SCCM, $H_2$ at 10 SCCM and $NH_3$ at 50 SCCM.

Next, in the step S25, a judgment is made about whether the flow rates of the starting gases supplied into the reaction chamber 1401 have reached steady states, and, on reaching the steady states, progress is made to the step S26 to effect irradiation of light from a light source, for example, a low pressure mercury lamp in the reaction chamber 1401 for the time of $t_1$, and a judgment is made about whether hydrogenated amorphous silicon nitride with a thickness of 20 Å has been deposited on the substrate based on the measured value by a film thickness measuring instrument in the step S27. If the film has been deposited to 20 Å, the process advances to the step S28, and the three-way valve on the farthermost downstream side of the $NH_3$ is changed toward the vent line 1490 so that no $NH_3$ flows into starting gas. Next, in the step S29, a judgment is made about whether the flow rates of the starting gas have reached steady state and, on reaching steady state, the process advances to the step S30, and light from the light source is irradiated for the time of $t_2$. Then, progressing to the step S31, a judgment is made about whether hydrogenated amorphous silicon with a thickness of 20 Å has been deposited on the substrate (the values of the above $t_1$ and $t_2$ can be determined by preparing previously single layer films and calculating in proportion to the light irradiation time and a film thickness deposited).

On reaching 20 Å, progress is made to the step S32 and a judgement is made about whether the number of the thin films laminated is 100. If the layer number is 100, the process advances to the step S33, while if it is not 100, by returning to the step S24, hydrogenated amorphous silicon nitride of 20 Å is deposited, followed further by deposition of hydrogenated amorphous silicon of 20 Å thereon.

And, when the number of thin films laminated has reached 100 in the step S32, the process advances to the step S33 and supplying of the starting gas into the reaction chamber 1401 is stopped. Next, in the step S34, the substrate after deposition of the thin films is taken out as described above (see FIG. 13).

Another process of deposition of a single layer film by the photolytic method by use of the device shown in FIG. 14 is described by referring to FIG. 7.

First, in the step S1, the reaction chamber 1401 is evacuated. This is done as follows. With the stop valve 1410 being closed, while opening the stop valve 1409 and the throttle valve 1412, the reaction chamber 1401 is brought to a vacuum degree of about $10^{-7}$ Torr by means of the exhauster 1404. During this operation, the reaction chamber 1401 may be internally subjected to baking by a heater.

Next, in the step S2, the substrate as the supporting member is set in the reaction chamber 1401. More specifically, first, by opening the lid at the upper portion of the preliminary chamber 1402, the substrate is mounted on the substrate conveying mechanism 1416 in the preliminary chamber 1402 under atmospheric pressure, then the lid at the upper portion of the preliminary chamber 1402 is closed and the stop valve 1411 is opened, followed by evacuation of the preliminary chamber 1402 by means of the exhauster 1406 to a vacuum degree of about $10^{-7}$ to $10^{-6}$ Torr. Subsequently, the gate valve 1403 is opened, the substrate is conveyed from the preliminary chamber 1402 to the reaction chamber 1401 by means of the substrate conveying mechanism 1416, then mounted on the substrate holder in the same chamber 1401, and again the substrate conveying mechanism 1416 is returned to the preliminary chamber 1402, and the gate valve 1403 is closed.

Next, in the step S3, the substrate in the reaction chamber 1401 is heated to a desired temperature. The substrate temperature is set generally at 100° to 500° C., preferably 200° to 400° C. (temperature control is performed by referring to the measured value on the thermometer 1423).

Next, in the step S4, the starting gas is supplied in the reaction chamber 1401. That is, by opening the stop valve 1414, at least one starting gas which is required is supplied from the gas supply 1413 into the reaction chamber 1401. During this operation, selection of the gas species and control of the gas flow rate can be done by control of the corresponding valves in the gas supply 1413 and control of the corresponding mass flow controllers and by referring to the flow rate detected value.

Next, in step S5, a judgment is made about whether the flow rate (or pressure) of the starting gas supplied into the reaction chamber 1401 has reached the steady state, and progress made to the step S6 on reaching the steady state to actuate the light source 1415, whereby light with a desired intensity is irradiated in the reaction chamber 1401 to effect photolysis of the reaction gas in the reaction chamber 1401. During this operation, since the reaction chamber 1401 is exhausted by the exhauster 1404 or 1405, the pressure in the reaction chamber is maintained by a difference between the amount of the starting gas supplied and the exhausted amount.

Figure 15:
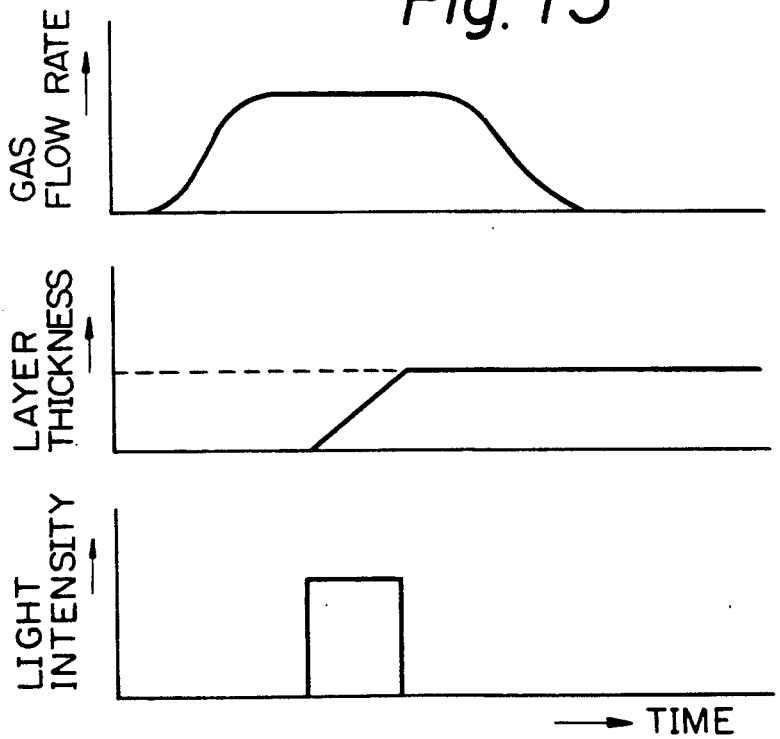

Next, in the step S7, a judgment is made about whether light irradiation has been conducted for a predetermined time and, on completion of irradiation for the predetermined time, the process advances to the step S8 to discontinue irradiation followed by stopping of supplying the starting gas into the reaction chamber 1 in the step S9. The series of actuations are shown in the graphs in FIG. 15.

Next, in the step S10, the substrate after deposition of the thin film is taken out. More specifically, the reaction chamber 1401 is again brought to a degree of vacuum degree of about $10^{-7}$ Torr to $10^{-6}$ Torr, and then the substrate is returned by means of the substrate conveying mechanism 1416 to the preliminary chamber 1402 by opening the gate valve 1403. The gate valve 1403 is closed and thereafter the preliminary chamber 1402 is returned to atmospheric pressure, and the substrate attached with the deposited film is taken out.

Referring now to FIG. 8, the procedure for depositing a non-single crystalline semiconductor multi-layer film on the substrate is to be described. Here, as an example, description is made of the case of laminating alternately hydrogenated amorphous silicon and hydrogenated amorphous silicon nitride on a substrate. For realizing the quantum size effect, the thickness of each layer is made 20 Å and 100 layers as the total, 50 layers for each material, are laminated. As the substrate, silicon wafer is used.

As shown in FIG. 8, the substrate is placed at the predetermined position in the reaction chamber 1401, and the process for heating (step S21–S23) is the same as described above.

Next, in the step S24, starting gases are supplied to the reaction chamber 1401. The starting gases employed are three kinds of gases including disilane ($Si_2H_6$), hydrogen ($H_2$) and ammonia ($NH_3$). The gas temperature is controlled to 100°–200° C. Control of the starting gas is described by referring to FIG. 16. First, by permitting $Si_2H_6$, $H_2$ and $NH_3$ on the side of the gas supplying pipe 1418 from the vent line 1490 by control of the three-way valve on the farthermost downstream side of the line, thereby mixing these gases. During this operation, the mixing ratio of the gases can be made variable by controlling the flow rates by means of the mass flow controllers of the respective lines. Here, for example, $Si_2H_6$ is permitted to flow at 0.5 SCCM, $H_2$ at 10 SCCM and $NH_3$ at 50 SCCM.

Next, in the step S25, a judgment is made about whether the flow rates of the starting gases supplied into the reaction chamber 1401 have reached steady states, and, on reaching the steady states, progress made to the step S26 to effect irradiation of light from a light source, for example, a low pressure mercury lamp in the reaction chamber 1401 for the time or $t_1$, and a judgment is made about whether hydrogenated amorphous silicon nitride with a thickness of 20 Å has been deposited on the substrate based on the measured value by a film thickness measuring instrument in the step S27. If the film has been deposited to 20 Å, progress is made to the step S28, and the three-way valve on the farthermost downstream side of the $NH_3$ line is changed toward the vent line 1490 so that no $NH_3$ flows into the starting gas. Next, in the step S29, a judgment is made about whether the flow rates of the starting gas have reached steady state and, on reaching steady state, process advances to the step S30, and light from the light source is irradiated for the time of $t_2$. Then, progressing to the step S31, a judgment is made about whether hydrogenated amorphous silicon with a thickness of 20 Å has been deposited on the substrate (the values of the above $t_1$ and $t_2$ can be determined by preparing previously single layer films and calculating in proportion to the light-irradiation time and a film thickness deposited). On reaching 20 Å, the process advances to the step S32 and a judgment is made about whether the number of the thin films laminated is 100. If the layer number is 100, the process advances to the step S33, while if it is not 100, by returning to the step S24, hydrogenated amorphous silicon nitride of 20 Å is deposited, followed further by deposition of hydrogenated amorphous silicon of 20 Å thereon.

And, when the number of thin films laminated has reached 100 in the step S32, progress is made to the step S33 and supplying of the starting gas into the reaction chamber 1401 is stopped. Next, in the step S34, the substrate after deposition of the thin film, is taken out as described above (see FIG. 16).

As described above, a non-single crystalline semiconductor multi-layer film can be automatically prepared on a substrate following the program previously designed.

One specific feature of the present invention resides in performing all of the flow rate control, the gas mixing, the temperature control and the above series of operations automatically by a controller for system control, whereby the thickness of each layer of the multi-layer film can be also controlled accurately.

Here, description has been made by referring to an example of a multi-layer film using hydrogenated amorphous silicon and hydrogenated amorphous silicon nitride. Further, it is also possible to carry out the embodiment of using a plurality of kinds of gases, the case of laminating different deposited films of 3 kinds or more or the case of preparing a multi-layer film comprising a non-single crystalline semiconductor, an insulating material and a metal according to the same procedure as described above.

Figure 16:
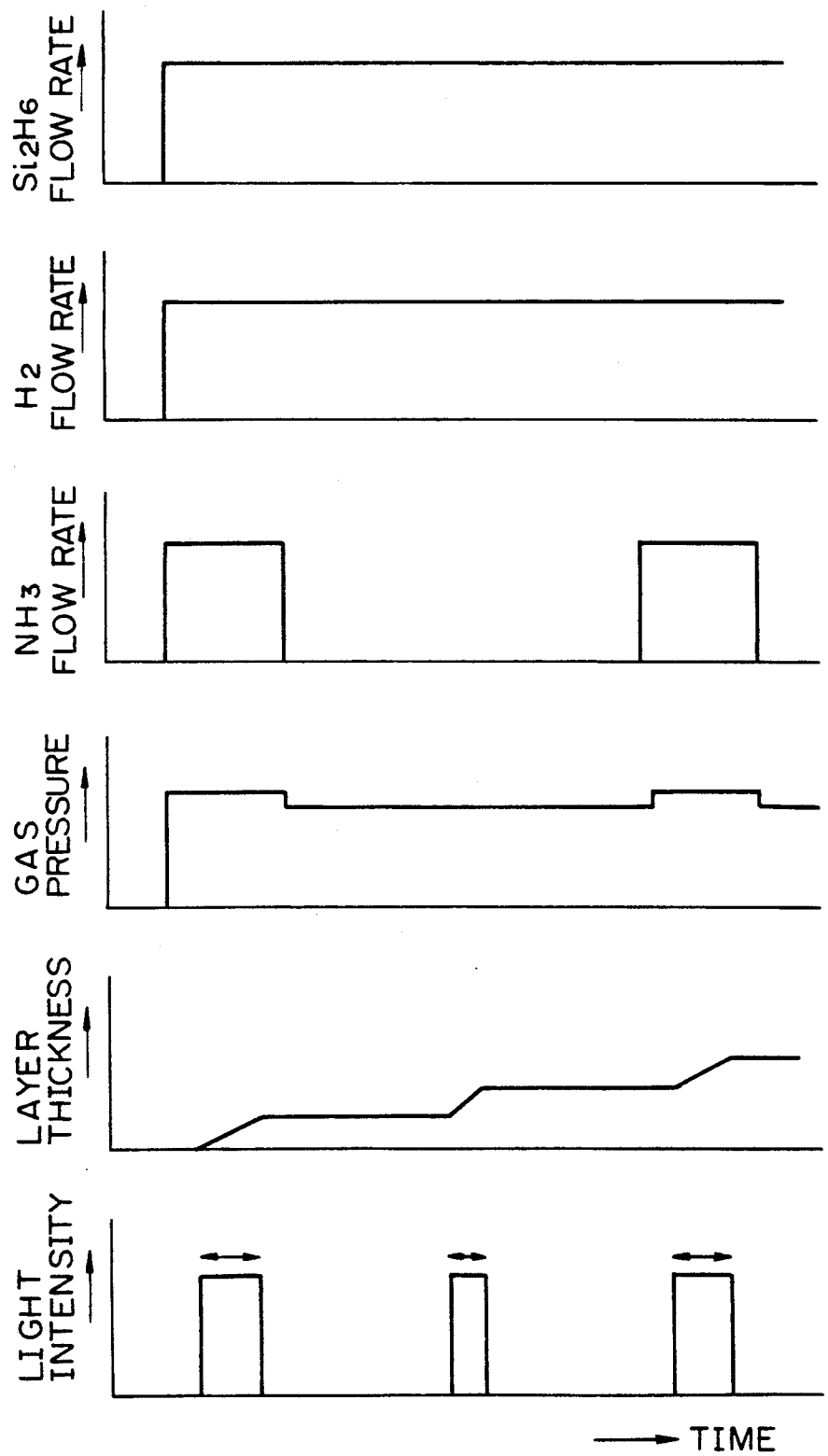

In the above examples, during preparation of a multi-layer thin film of hydrogenated amorphous silicon and hydrogenated amorphous silicon nitride, it is possible to control the flow of the gas mixture as a matter of course by permitting all of the reaction gases to flow intermittently, although description has been made about the case in which a part of the reaction gases, namely $Si_2H_6$ and $H_2$ were flowed continuously and only $NH_3$ intermittently as shown in FIG. 16.

The film may be sometimes deposited also on the light incident window to lower transmittance of light. In such a case, it is also possible to retreat once the substrate back to the preliminary chamber 1402, and effect etching of the inner surface of the window by introducing an etchable gas such as $CF_4$ into the reaction chamber 1 and causing optical etching reaction by use of the light source 1415.

We claim:

1. A device for forming a deposited film, comprising:
   a reaction chamber, comprising vacuum degree measuring means for measuring the degree of vacuum in said chamber;
   temperature control means for heating or cooling a substrate placed in said reaction chamber;
   starting gas introducing means for introducing two or more kinds of starting gases into said reaction chamber;
   a light source for decomposing starting gases by irradiating at least one kind of light in said reaction chamber so as to deposit thin film on the substrate controlled to a predetermined temperature by said temperature control means in said reaction chamber;
   film thickness measuring means for measuring the thickness of the film deposited on the substrate in said reaction chamber;
   mass analyzing means for analyzing the mass of gases in said reaction chamber connected thereto; and
   system control means having a central processing unit for automatically controlling said starting gas introducing means and said light source based on the measured values of said measuring means,
   wherein said control means, said starting gas introducing means and said light source perform their functions based on the measured values of the film thickness, measured values of the degree of vacuum and the analytical values of said mass analyzing means.

* * * * *

UNITED STATES PATENT AND TRADEMARK OFFICE
CERTIFICATE OF CORRECTION

PATENT NO. : 5,261,961
DATED : November 16, 1993
INVENTOR(S) : Takasu et al.

It is certified that error appears in the above-indentified patent and that said Letters Patent is hereby corrected as shown below:

COLUMN 1:

Line 4, "continuation-in-part" should read --continuation--.

Signed and Sealed this

Thirtieth Day of August, 1994

Attest:

BRUCE LEHMAN

*Attesting Officer*    *Commissioner of Patents and Trademarks*